(12) United States Patent
Ryu et al.

(10) Patent No.: US 12,080,791 B2
(45) Date of Patent: Sep. 3, 2024

(54) SEMICONDUCTOR MEMORY DEVICE AND METHOD FOR FABRICATING THE SAME

(71) Applicant: Samsung Electronics Co., Ltd., Suwon-si (KR)

(72) Inventors: Min Tae Ryu, Hwaseong-si (KR); Sang Hoon Uhm, Yongin-si (KR); Ki Seok Lee, Hwaseong-si (KR); Min Su Lee, Seongnam-si (KR); Won Sok Lee, Suwon-si (KR); Min Hee Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 506 days.

(21) Appl. No.: 17/400,218

(22) Filed: Aug. 12, 2021

(65) Prior Publication Data

US 2022/0223732 A1 Jul. 14, 2022

(30) Foreign Application Priority Data

Jan. 13, 2021 (KR) .................. 10-2021-0004360

(51) Int. Cl.
*H01L 29/78* (2006.01)
*H01L 27/088* (2006.01)
(Continued)

(52) U.S. Cl.
CPC ........ *H01L 29/7813* (2013.01); *H01L 27/088* (2013.01); *H01L 29/24* (2013.01); *H10B 12/30* (2023.02)

(58) Field of Classification Search
CPC ... H01L 27/088; H01L 27/1225; H01L 29/04; H01L 29/24; H01L 29/1033; H01L 29/66666; H01L 29/7813; H01L 29/7827; H01L 29/7869; H01L 29/78642; H10B 12/03; H10B 12/033; H10B 12/05; H10B 12/315; H10B 12/482; H10B 12/488
(Continued)

(56) References Cited

U.S. PATENT DOCUMENTS 9,660,104 B2 5/2017 Yamazaki
10,424,676 B2 9/2019 Sasagawa et al.
(Continued)

*Primary Examiner* — Fazli Erdem
(74) *Attorney, Agent, or Firm* — Harness, Dickey & Pierce, P.L.C.

(57) ABSTRACT

A semiconductor memory device with improved performance by improving interface characteristics while reducing a leakage current, and a method for fabricating the same are provided. The semiconductor memory device includes a conductive line on a substrate, a first interlayer insulating layer exposing the conductive line and defining a channel trench on the substrate, a channel layer extending along a bottom and side surface of the channel trench, a first gate electrode and a second gate electrode spaced apart from each other in the channel trench, a first gate insulating layer between the channel layer and the first gate electrode, and a second gate insulating layer between the channel layer and the second gate electrode. The channel layer includes a first oxide semiconductor layer and a second oxide semiconductor layer sequentially stacked on the conductive line. The first oxide semiconductor layer has a greater crystallinity than the second oxide semiconductor layer.

20 Claims, 35 Drawing Sheets

(51) Int. Cl.
*H01L 29/24* (2006.01)
*H10B 12/00* (2023.01)

(58) Field of Classification Search
USPC .......................................................... 257/43
See application file for complete search history.

(56) References Cited

U.S. PATENT DOCUMENTS

| | | |
|---|---|---|
| 10,714,400 B2 | 7/2020 | Torek |
| 10,734,530 B2 | 8/2020 | Yamazaki et al. |
| 10,790,396 B2 | 9/2020 | Sawabe et al. |
| 2013/0187152 A1* | 7/2013 | Yamazaki ......... H01L 29/78621 |
| | | 257/43 |
| 2013/0320337 A1* | 12/2013 | Yamazaki ............ G09G 3/3648 |
| | | 257/43 |
| 2019/0296155 A1* | 9/2019 | Sawabe ............. H01L 29/66969 |
| 2020/0194434 A1* | 6/2020 | Alzate Vinasco ...... H01L 28/60 |
| 2020/0212060 A1* | 7/2020 | Yoo ....................... H01L 29/267 |
| 2020/0411520 A1* | 12/2020 | Lajoie .................... H01L 28/90 |
| 2020/0411525 A1* | 12/2020 | Lajoie .................. H10B 12/315 |

\* cited by examiner

SEMICONDUCTOR MEMORY DEVICE AND METHOD FOR FABRICATING THE SAME

CROSS-REFERENCE TO RELATED APPLICATION

This application claims priority from Korean Patent Application No. 10-2021-0004360 filed on Jan. 13, 2021 in the Korean Intellectual Property Office, and all the benefits accruing therefrom under 35 U.S.C. § 119, the contents of which in its entirety are herein incorporated by reference.

BACKGROUND

Some example embodiments relate to a semiconductor memory device and a method for fabricating the same. More particularly, some example embodiments relate to a semiconductor memory device including a vertical channel transistor (VCT) and/or a method for fabricating the same.

In order to satisfy consumer demands for superior performance and/or inexpensive prices, it is desired to increase the integration density of semiconductor memory devices. In a semiconductor memory device, since the integration density of the semiconductor memory device is an important factor in determining the price of a product, an increased integration density is particularly desirable.

In the case of a two-dimensional or planar semiconductor memory device, the integration density is mainly determined by the area occupied by a unit memory cell, and thus the integration density is greatly influenced by the level of fine pattern formation technology. However, since high-priced equipment is utilized for the miniaturization of patterns, the integration density of the two-dimensional semiconductor memory device has been increased but is still limited. Accordingly, semiconductor memory devices including vertical channel transistors in which a channel extends in a vertical direction have been proposed.

SUMMARY

Some example embodiments provide a semiconductor memory device with improved performance by improving interface characteristics while reducing a leakage current.

Some example embodiments also provide a method for fabricating a semiconductor memory device with improved performance.

However, aspects of example embodiments are not restricted to those set forth herein. The above and other aspects of example embodiments will become more apparent to one of ordinary skill in the art to which example embodiments pertains by referencing the detailed description of the present disclosure given below.

According to some example embodiments, there is provided a semiconductor memory device comprising a conductive line on a substrate and extending in a first direction, a first interlayer insulating layer on the substrate, the first interlayer insulating layer exposing at least a portion of the conductive line and defining a channel trench extending in a second direction that crosses the first direction, a channel layer extending along a bottom surface of the channel trench and along a side surface of the channel trench, a first gate electrode and a second gate electrode spaced apart from each other in the first direction and extending in the second direction, the first gate electrode and the second gate electrode in the channel trench, a first gate insulating layer between the channel layer and the first gate electrode, and a second gate insulating layer between the channel layer and the second gate electrode. The channel layer includes a first oxide semiconductor layer and a second oxide semiconductor layer sequentially stacked on the conductive line, and the first oxide semiconductor layer has a greater crystallinity than the second oxide semiconductor layer.

According to some example embodiments, there is provided a semiconductor memory device comprising a conductive line on a substrate and extending in a first direction, a first interlayer insulating layer on the substrate, the first interlayer insulating layer exposing at least a portion of the conductive line and including a channel trench extending in a second direction that crosses the first direction, a channel layer extending along a bottom surface of the channel trench and along a side surface of the channel trench, a first gate electrode in the channel trench, the first gate electrode extending in the second direction, and a first gate insulating layer between the channel layer and the first gate electrode. The channel layer includes a first oxide semiconductor layer and a second oxide semiconductor layer sequentially stacked on the conductive line, the first oxide semiconductor layer has a greater crystallinity than the second oxide semiconductor layer, the first gate insulating layer includes a first dielectric layer and a second dielectric layer sequentially stacked on the channel layer, and the second dielectric layer has a higher dielectric constant than the first dielectric layer.

According to some example embodiments, there is provided a semiconductor memory device comprising a bit line on a substrate and extending in a first direction, a first interlayer insulating layer on the substrate, the first interlayer insulating layer exposing at least a portion of the bit line and including a channel trench extending in a second direction that crosses the first direction, a channel layer extending along a bottom surface of the channel trench and along a side surface of the channel trench, a first word line and a second word line spaced apart from each other in the first direction and extending in the second direction, the first word line and the second word line in the channel trench, a first gate insulating layer between the channel layer and the first word line, a second gate insulating layer between the channel layer and the second word line, a first capacitor structure on the first interlayer insulating layer and connected to one end of the channel layer that is adjacent to the first word line, and a second capacitor structure on the first interlayer insulating layer and connected to the other end of the channel layer that is adjacent to the second word line. The channel layer includes a first oxide semiconductor layer and a second oxide semiconductor layer sequentially stacked on the bit line, and the first oxide semiconductor layer has a greater crystallinity than the second oxide semiconductor layer.

According to some example embodiments, there is provided a semiconductor memory device comprising a conductive line on a substrate and extending in a first direction, a first interlayer insulating layer on the substrate and exposing at least a portion of the conductive line and defining a channel trench that extends in a second direction, the second direction crossing the first direction, a channel layer extending along a bottom surface and of the channel trench and along a side surface of the channel trench, the channel layer including an oxide semiconductor, a first gate electrode and a second gate electrode spaced apart from each other in the first direction and extending in the second direction, respectively, the first gate electrode and the second gate electrode in the channel trench, a first gate insulating layer between the channel layer and the first gate electrode, and a second gate insulating layer between the channel layer and the second gate electrode. Each of the first gate insulating layer and the second gate insulating layer includes a first dielectric layer and a second dielectric layer sequentially stacked on the channel layer, and the second dielectric layer has a higher dielectric constant than the first dielectric layer.

According to some example embodiments, there is provided a method for fabricating a semiconductor memory device, comprising forming a conductive line on a substrate that extends in a first direction, forming a first interlayer insulating layer on the substrate, the first interlayer insulating layer exposing at least a portion of the conductive line and defining a channel trench extending in a second direction crossing the first direction, forming a channel layer extending along a bottom surface of the channel trench and along a side surface of the channel trench, forming a preliminary gate insulating layer on the channel layer, the preliminary gate insulating layer extending along the channel layer, forming a preliminary gate electrode layer on the gate insulating layer, the preliminary gate electrode layer extending along the preliminary gate insulating layer, and cutting the preliminary gate electrode layer to form a first gate electrode and a second gate electrode spaced apart from each other in the first direction. The forming of the channel layer comprises sequentially stacking a first oxide semiconductor layer and a second oxide semiconductor layer on the conductive line, and the first oxide semiconductor layer has a greater crystallinity than the second oxide semiconductor layer.

BRIEF DESCRIPTION OF THE DRAWINGS

The above and other aspects and/or features of example embodiments will become more apparent by describing in detail example embodiments thereof with reference to the attached drawings, in which.

DETAILED DESCRIPTION OF SOME EXAMPLE EMBODIMENTS

Hereinafter, a semiconductor memory device according to example embodiments will be described with reference to FIGS. 1 to 10.

Figure 1:
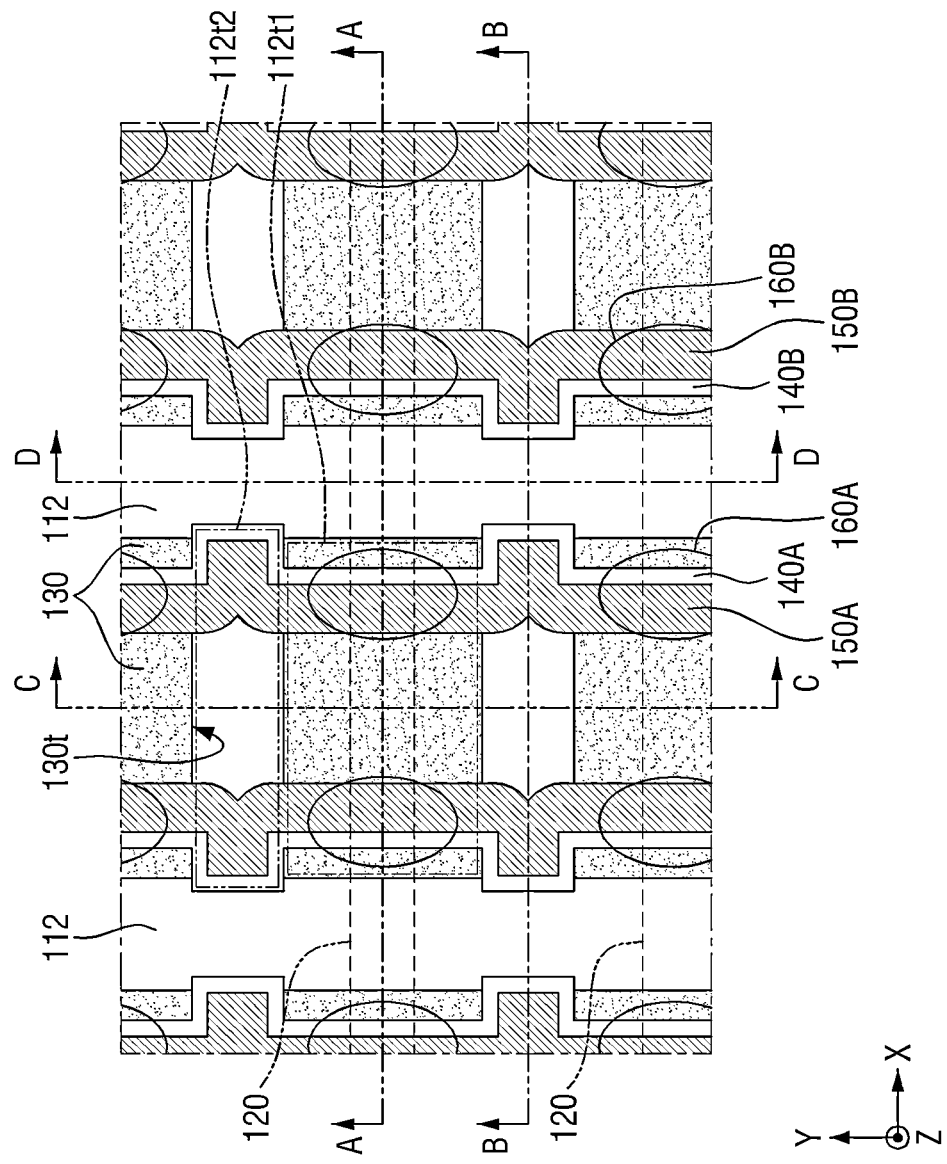
FIG. 1 is a layout diagram illustrating a semiconductor memory device according to some example embodiments.
Figure 2:
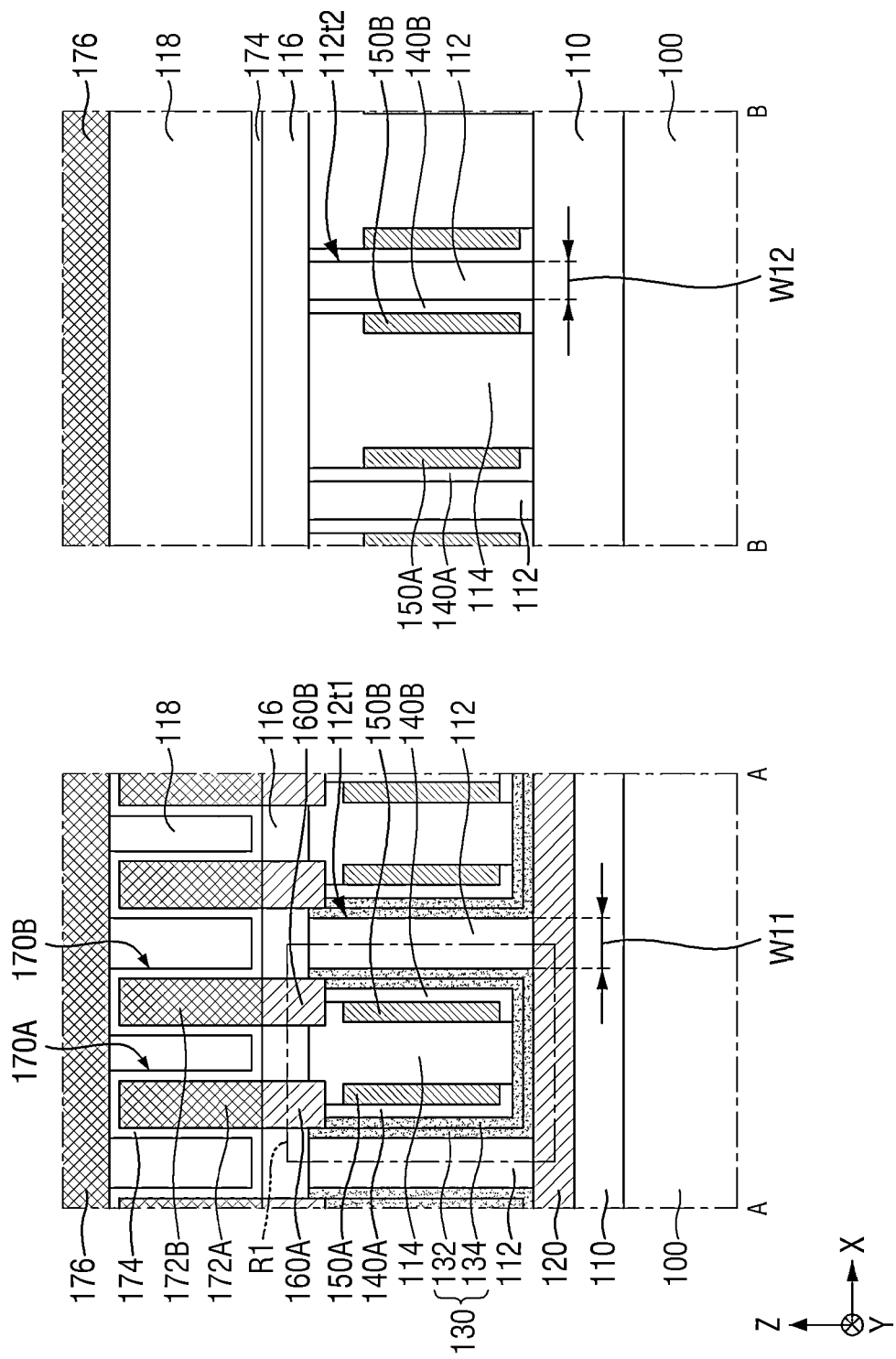
FIG. 2 is a cross-sectional view taken along lines A-A and B-B of FIG. 1.
Figure 3:
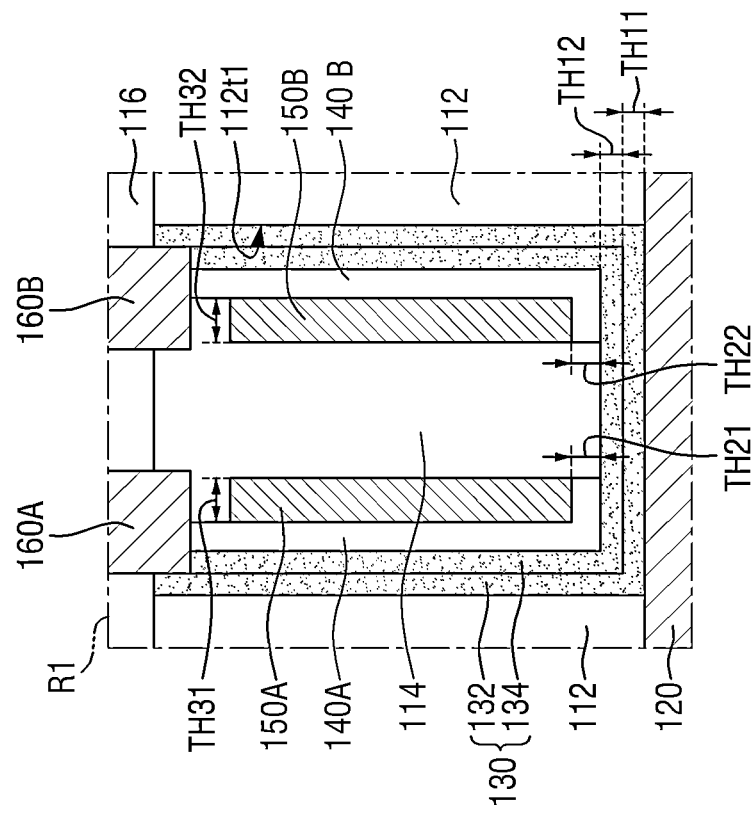
FIG. 3 is an enlarged view illustrating area R1 of FIG. 2.
Figure 4:
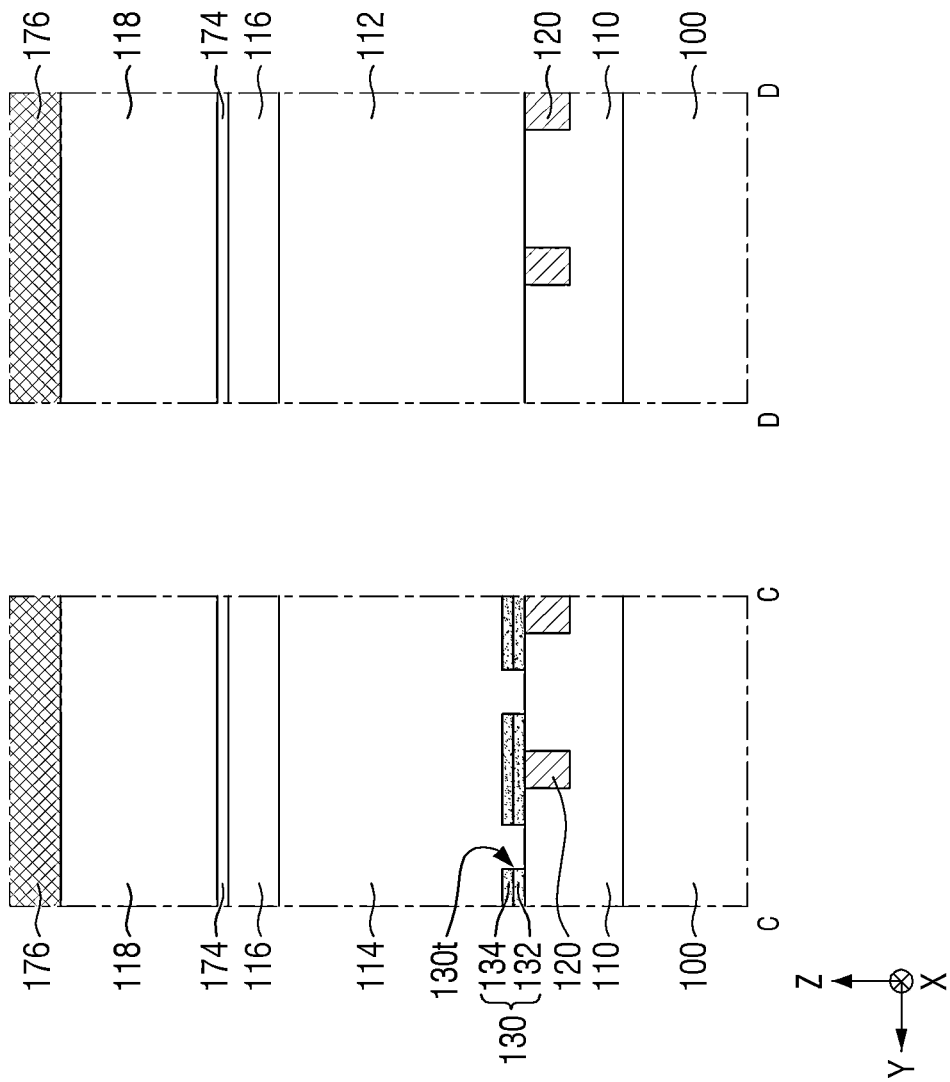
FIG. 4 is a cross-sectional view taken along lines C-C and D-D of FIG. 1.

FIG. 1 is a layout diagram illustrating a semiconductor memory device according to some example embodiments. FIG. 2 is a cross-sectional view taken along lines A-A and B-B of FIG. 1. FIG. 3 is an enlarged view illustrating area R1 of FIG. 2. FIG. 4 is a cross-sectional view taken along lines C-C and D-D of FIG. 1.

Referring to FIGS. 1 to 4, a semiconductor memory device according to some example embodiments includes a substrate 100, a conductive line 120, a first interlayer insulating layer 112, a channel layer 130, and gate electrodes 150A and 150B, gate insulating layers 140A and 140B, a filling insulating layer 114, landing pads 160A and 160B, and capacitor structures 170A and 170B.

The substrate 100 may have a structure in which a base substrate and a heterogeneous or homogeneous epitaxial layer are stacked, but example embodiments are not limited thereto. The substrate 100 may be or may include a silicon substrate, a gallium arsenide substrate, a silicon germanium substrate, or a silicon-on-insulator (SOI) substrate. For example, hereinafter, it is assumed that the substrate 100 is a silicon substrate. The substrate may be single-crystal, and/or may be lightly doped with impurities; however, example embodiments are not limited thereto.

The conductive line 120 may be formed on or directly on the substrate 100. For example, the lower insulating layer 110 may be formed on the substrate 100, and the conductive line 120 may be disposed on the lower insulating layer 110. The conductive line 120 may be elongated in/may extend in a first direction X. Each of the plurality of conductive lines 120 may extend in the first direction X, and may be spaced apart at equal intervals in a second direction Y crossing the first direction X. The lower insulating layer 110 may be formed to fill the space between the conductive lines 120. In some example embodiments, the top surface of the lower insulating layer 110 may be disposed at the same level as the top surface of the conductive lines 120. For example, the lower insulating layer 110 may be planar with the conductive lines 120. The conductive line 120 may function as a bit line or a column line of a semiconductor memory device according to some example embodiments.

The conductive line 120 may include doped polysilicon, metal, conductive metal nitride, conductive metal silicide, conductive metal oxide, or a combination thereof. For example, the conductive line 120 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto. Alternatively or additionally, the conductive line 120 may include a two-dimensional (2D) semiconductor material. The 2D semiconductor material may include, for example, graphene, carbon nanotubes, or a combination thereof. The conductive line 120 may include a single layer or multiple layers of the above-described conductive materials.

The first interlayer insulating layer 112 may be formed on or directly on the substrate 100. For example, the first interlayer insulating layer 112 may be disposed on the top surface of the lower insulating layer 110. The first interlayer insulating layer 112 may include, or may define, a first channel trench 112t1 and a second channel trench 112t2. The first channel trench 112t1 and the second channel trench 112t2 may be alternately disposed in the second direction Y. The first channel trench 112t1 and the second channel trench 112t2 are connected to each other. The first channel trench 112t1 and the second channel trench 112t2 connected to each other may extend in the second direction or be elongated in the second direction Y.

Each of the plurality of first channel trenches 112t1 may extend in the second direction Y and may be spaced apart at equal intervals in the first direction X. The first channel trench 112t1 may expose a part of the conductive line 120. For example, the bottom surface of the first channel trench 112t1 may expose a part of the top surface of the conductive line 120. In some example embodiments, each of the first interlayer insulating layers 112 may extend in the second direction Y, and may form a plurality of insulating patterns spaced apart from each other by the first channel trench 112t1 and the second channel trench 112t2. The first channel trench 112t1 and the second channel trench 112t2 connected to each other may be positioned between insulating patterns adjacent to each other in the first direction X.

The side surface of the first interlayer insulating layer 112 defined by the second channel trench 112t2 may protrude more in the first direction X than the side surface of the first interlayer insulating layer 112 defined by the first channel trench 112t1. Accordingly, a width W11 of the first interlayer insulating layer 112 defined by the first channel trench 112t1 may be greater than a width W12 of the first interlayer insulating layer 112 defined by the second channel trench 112t2. This may be due to the characteristics of the etching process for forming a separation trench 130t, which will be described later. However, this is only for example, and the width W11 of the first interlayer insulating layer 112 defined by the first channel trench 112t1 may be the same as or less than the width W12 of the first interlayer insulating layer 112 defined by the second channel trench 112t2.

The first interlayer insulating layer 112 may include, for example, at least one of silicon oxide, silicon oxynitride, silicon nitride, and a low-k material having a lower dielectric constant than silicon oxide, but is not limited thereto. The low-k material may include, for example, at least one of flowable oxide (FOX), tonen silazene (TOSZ), undoped silicate glass (USG), borosilicate glass (BSG), phosphosilicate glass (PSG), borophosphosilicate glass (BPSG), plasma enhanced tetra ethyl ortho silicate (PETEOS), fluoride silicate glass (FSG), carbon doped silicon oxide (CDO), Xerogel, Aerogel, amorphous fluorinated carbon, organo silicate glass (OSG), parylene, bis-benzocyclobutene (BCB), SILK, polyimide, a porous polymeric material, and a combination thereof, but example embodiments are not limited thereto.

The channel layer 130 may be formed in the first interlayer insulating layer 112. The channel layer 130 may extend along the profile of the first channel trench 112t1. For example, the channel layer 130 may conformally extend along the bottom surface and the side surface of the first channel trench 112t1. For example, in a cross section crossing the second direction Y, the channel layer 130 may have a "U" shape. A plurality of channel layers 130 may be spaced apart from each other by an insulating pattern formed by the first interlayer insulating layer 112 and may be arranged along the first direction X. Since the first channel trench 112t1 may expose the conductive line 120, the channel layer 130 may be connected to the conductive line 120. For example, a part of the channel layer 130 extending along the bottom surface of the first channel trench 112t1 may be in contact with or direct contact with the top surface of the conductive line 120.

The separation trench 130t may be defined between the channel layers 130 adjacent in the second direction Y. The separation trench 130t may extend in the first direction X and may cut the channel layer 130 extending in the second direction Y within the first channel trench 112t1. Accordingly, the plurality of channel layers 130 may be spaced apart from each other in the first direction X and the second direction Y and may be arranged in a matrix form, e.g. in a rectangular array form.

In the semiconductor memory device according to some example embodiments, the channel layer 130 may include a first source/drain region and a second source/drain region arranged along the vertical direction (e.g., a third direction Z crossing the first direction X and the second direction Y). For example, a lower portion of the channel layer 130 may function as a first source/drain region and may be connected to conductive line 120, an upper portion of the channel layer 130 may function as a second source/drain region and may be connected to a landing pad 160A or 160B, and a portion of the channel layer 130 between the first source/drain region and the second source/drain region may function as a channel region and may be controlled by gate electrodes 150A or 150B.

In some example embodiments, the channel layer 130 may include an oxide semiconductor material. The oxide semiconductor material may include, for example, indium gallium zinc oxide ($In_xGa_yZn_zO$, IGZO), indium gallium silicon oxide, ($In_xGa_ySi_zO$, IGSO), indium tin zinc oxide ($In_xSn_yZn_zO$, ITZO), indium gallium tin oxide ($In_xGa_ySn_zO$, IGTO), indium zinc oxide ($In_xZn_yO$, IZO), zinc oxide ($Zn_xO$, ZnO), zinc tin oxide ($Zn_xSn_yO$, ZTO), zinc oxynitride ($Zn_xO_yN$, ZnON), zirconium zinc tin oxide ($Zr_xZn_ySn_zO$, ZZTO), tin oxide ($Sn_xO$, SnO), hafnium indium zinc oxide ($Hf_xIn_yZn_zO$, HIZO), gallium zinc tin oxide ($Ga_xZn_ySn_zO$, GZTO), aluminium zinc tin oxide ($Al_xZn_ySn_zO$, AZTO), ytterbium gallium zinc oxide ($Yb_xGa_yZn_zO$, YGZO), indium gallium oxide ($In_xGa_yO$, IGO), or a combination thereof. Alternatively or additionally, the channel layer 130 may include a 2D semiconductor material. The 2D semiconductor material may include, for example, graphene, carbon nanotubes, or a combination thereof. The channel layer 130 may include a single layer or multiple layers of the oxide semiconductor materials described above.

In some example embodiments, the channel layer 130 may have a band gap energy greater than that the band gap energy of silicon (Si). For example, the channel layer 130 may have a band gap energy of about 1.5 eV to 5.6 eV. In some example embodiments, the channel layer 130 may have a band gap energy of about 2.0 eV to 4.0 eV. The channel layer 130 may be or have a phase that is, for example, polycrystalline and/or amorphous, but example embodiments are not limited thereto. As another example, the channel layer 130 may be a single crystal. The channel layer 130 may be doped with impurities such as at least one of boron, carbon, phosphorus, or arsenic; however, example embodiments are not limited thereto. Alternatively, the channel layer 130 may be undoped.

In some example embodiments, the channel layer 130 may include a first oxide semiconductor layer 132 and a second oxide semiconductor layer 134 sequentially stacked on the conductive line 120. For example, the first oxide semiconductor layer 132 may conformally extend along or directly along the bottom surface and the side surface of the first channel trench 112t1. A part of the first oxide semiconductor layer 132 extending along the bottom surface of the first channel trench 112t1 may be in contact with or in direct contact with the top surface of the conductive line 120. The second oxide semiconductor layer 134 may be formed on the first oxide semiconductor layer 132. The second oxide semiconductor layer 134 may conformally extend along the first oxide semiconductor layer 132.

Although it is only illustrated that a thickness TH11 of the first oxide semiconductor layer 132 and a thickness TH12 of the second oxide semiconductor layer 134 are the same, this is only an example. Unlike the illustrated example, the thickness TH11 of the first oxide semiconductor layer 132 may be smaller than or greater than the thickness TH12 of the second oxide semiconductor layer 134.

Each of the first oxide semiconductor layer 132 and the second oxide semiconductor layer 134 may include an oxide semiconductor material. In some example embodiments, each of the first oxide semiconductor layer 132 and the second oxide semiconductor layer 134 may include an oxide semiconductor material including indium (In). For example, each of the first oxide semiconductor layer 132 and the second oxide semiconductor layer 134 may include at least one of IGZO, IGSO, ITZO, IGTO, IZO, HIZO, IGO, and a combination thereof.

In some example embodiments, the first oxide semiconductor layer 132 may have a greater crystallinity than the second oxide semiconductor layer 134. Here, the crystallinity means the ratio of the mass (or volume) of the crystal part to the total mass (or volume) of the material including the crystal part. For example, the ratio of the crystal part formed in the first oxide semiconductor layer 132 may be greater than the ratio of the crystal part formed in the second oxide semiconductor layer 134. For example, the first oxide semiconductor layer 132 may include a crystalline or semi-crystalline oxide semiconductor material, and the second oxide semiconductor layer 134 may include an amorphous oxide semiconductor material. For example, the first oxide semiconductor layer 132 may include at least one of spinel IGZO and c-axis aligned crystalline IGZO (CAAC IGZO). For example, the second oxide semiconductor layer 134 may include at least one of amorphous IGZO, amorphous ITO, and amorphous IGTO. The crystallinity may be measured with an appropriate analytical technique, such as but not limited to a transmission electron microscope (TEM) microgram image and/or x-ray diffraction (XRD) techniques; however, example embodiments are not limited thereto.

The gate electrodes 150A and 150B may be formed in the first channel trench 112t1 and the second channel trench 112t2. Each of the gate electrodes 150A and 150B may be elongated in and extend in the second direction Y to cross the conductive line 120. In some example embodiments, the gate electrodes 150A and 150B may include the first gate electrode 150A and the second gate electrode 150B spaced apart from each other in the first direction X. The first gate electrode 150A and the second gate electrode 150B may face each other in the first channel trench 112t1 and the second channel trench 112t2. For example, the first channel trench 112t1 may include a first side surface and a second side surface that face in the first direction X. The first gate electrode 150A may extend along a first side surface of the first channel trench 112t1, and the second gate electrode 150B may extend along a second side surface of the first channel trench 112t1. In this case, two transistor structures per one channel layer 130 may be implemented. The first gate electrode 150A may function as a first word line or the row line of the semiconductor memory device according to some example embodiments, and the second gate electrode 150B may function as a second word line of the semiconductor memory device according to some example embodiments.

Each of the gate electrodes 150A and 150B may include doped polysilicon, metal, conductive metal nitride, conductive metal silicide, conductive metal oxide, or a combination thereof. For example, each of the gate electrodes 150A and 150B may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but example embodiments are not limited thereto.

The gate insulating layers 140A and 140B may be interposed between the channel layer 130 and the gate electrodes 150A and 150B. For example, the gate insulating layers 140A and 140B may extend conformally along the channel layer 130. Alternatively or additionally, the gate insulating layers 140A and 140B may extend along the bottom surface and the side surface of the gate electrodes 150A and 150B. For example, in a cross section crossing the second direction Y, each of the gate insulating layers 140A and 140B may have an "L" shape.

In some example embodiments, the gate insulating layers 140A and 140B may include the first gate insulating layer 140A and the second gate insulating layer 140B spaced apart from each other in the first direction X. The first gate insulating layer 140A may be interposed between the channel layer 130 and the first gate electrode 150A, and the second gate insulating layer 140B may be interposed between the channel layer 130 and the second gate electrode 150B. The first gate insulating layer 140A and the second gate insulating layer 140B may face each other in the first channel trench 112t1. For example, the first gate insulating layer 140A may extend along the first side surface of the first channel trench 112t1, and the second gate insulating layer 140B may extend along the second side surface of the first channel trench 112t1.

In some example embodiments, one end of each of the gate insulating layers 140A and 140B may be aligned on side surfaces of the corresponding gate electrodes 150A and 150B. For example, one end (e.g. a bottom end) of the first gate insulating layer 140A extending along the bottom surface of the first gate electrode 150A may be aligned on the side surface of the first gate electrode 150A facing the second gate electrode 150B. In addition, for example, one end (e.g. a bottom end) of the second gate insulating layer 140B extending along the bottom surface of the second gate electrode 150B may be aligned on the side surface of the second gate electrode 150B facing the first gate electrode 150A. This may be due to the characteristics of the etching process for forming the gate electrodes 150A and 150B and the gate insulating layers 140A and 140B.

Each of the gate insulating layers 140A and 140B may include silicon oxide, silicon oxynitride, a high-k material having a higher dielectric constant than silicon oxide, or a combination thereof. The high-k material may include, for example, hafnium oxide (HfO$_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), zirconium oxide (ZrO$_2$), aluminum oxide (Al$_2$O$_3$), or a combination thereof, but example embodiments are not limited thereto.

In some example embodiments, a thickness TH21 of the first gate insulating layer 140A may be the same as a thickness TH22 of the second gate insulating layer 140B, and a thickness TH31 of the first gate electrode 150A may be the same as a thickness TH32 of the second gate electrode

150B. The term "same" as used herein not only means being completely identical but also includes a minute difference that may occur due to a process margin and/or the like.

In some example embodiments, the first gate insulating layer 140A and the second gate insulating layer 140B may be formed at the same level, and the first gate electrode 150A and the second gate electrode 150B may be formed at the same level. The term "being formed at the same level" as used herein means being formed by the same manufacturing or fabrication process. For example, the first gate insulating layer 140A and the second gate insulating layer 140B may have the same material composition, and the first gate electrode 150A and the second gate electrode 150B may have the same material composition.

The filling insulating layer 114 may be formed in the first channel trench 112t1 and the second channel trench 112t2. The filling insulating layer 114 may fill the first channel trench 112t1 and the second channel trench 112t2 remaining after the channel layer 130, the gate insulating layers 140A and 140B, and the gate electrodes 150A and 150B are formed. Alternatively or additionally, the filling insulating layer 114 may fill the separation trench 130t defined between the channel layers 130 adjacent to each other in the second direction Y. For simplicity of description, illustration of the filling insulating layer 114 in FIG. 1 is omitted.

The filling insulating layer 114 may include, for example, at least one of silicon oxide, silicon oxynitride, silicon nitride, and a low-k material having a lower dielectric constant than silicon oxide, but example embodiments are not limited thereto.

The landing pads 160A and 160B may be formed on the first interlayer insulating layer 112 and the filling insulating layer 114. The landing pads 160A and 160B may be connected to or directly connected to the channel layer 130. For example, the second interlayer insulating layer 116 may be formed on the first interlayer insulating layer 112 and the filling insulating layer 114. The landing pads 160A and 160B may penetrate the second interlayer insulating layer 116 and may be connected to the upper portion of the channel layer 130. In some example embodiments, the top surface of the second interlayer insulating layer 116 may be disposed at the same level as the top surfaces of the landing pads 160A and 160B.

In some example embodiments, each of the landing pads 160A and 160B may be disposed to overlap at least a part of the channel layer 130 in the vertical direction (e.g., the third direction Z). The plurality of landing pads 160A and 160B may be spaced apart from each other in the first direction X and the second direction Y and may be arranged in a matrix form. However, this is only an example, and as long as being connected to the channel layer 130, the plurality of landing pads 160A and 160B may be arranged in various other forms such as a honeycomb form or a regular hexagonal form.

In some example embodiments, the landing pads 160A and 160B may include the first landing pad 160A and the second landing pad 160B spaced apart from each other in the first direction X. The first landing pad 160A may be in contact with one end of the channel layer 130 adjacent to the first gate electrode 150A, and the second landing pad 160B may be in contact with the other end of the channel layer 130 adjacent to the second gate electrode 150B. Although it is only illustrated that the first landing pad 160A overlaps the first gate electrode 150A in the third direction Z and the second landing pad 160B overlaps the second gate electrode 150B in the third direction Z, this is only for example. As long as each of the first landing pad 160A and the second landing pad 160B is connected to the channel layer 130, the disposition of the first landing pad 160A and the second landing pad 160B may vary.

In some example embodiments, each of the landing pads 160A and 160B may be in contact with or direct contact with at least a part of the side surface of the channel layer 130. In this case, the contact area between each of the landing pads 160A and 160B and the channel layer 130 may increase, so that the interface resistance may decrease and/or a speed of operation of the semiconductor device may increase. For example, as illustrated, each of the landing pads 160A and 160B may be in contact with the side surface of the first oxide semiconductor layer 132 and the top surface of the second oxide semiconductor layer 134.

Each of the landing pads 160A and 160B may include doped polysilicon, metal, conductive metal nitride, conductive metal silicide, conductive metal oxide, or a combination thereof. For example, each of the landing pads 160A and 160B may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but example embodiments are not limited thereto.

The capacitor structures 170A and 170B may be formed on the landing pads 160A and 160B. The capacitor structures 170A and 170B may be arranged to correspond to the landing pads 160A and 160B. The landing pads 160A and 160B may electrically connect the channel layer 130 and the capacitor structures 170A and 170B. Each of the capacitor structures 170A and 170B may include lower electrodes 172A and 172B, a capacitor dielectric layer 174 and an upper electrode 176. The capacitor structures 170A and 170B may store electric charges in the capacitor dielectric layer 174 using a potential difference generated between the lower electrodes 172A and 172B and the upper electrode 176. Although the capacitor structures 170A and 170B may operate as linear capacitors, example embodiments are not limited thereto. For example, the capacitor structures 170A and 170B may operate non-linearly, and/or may operate as hysteresis structures and/or memristor structures.

The lower electrodes 172A and 172B may be electrically connected to the landing pads 160A and 160B. Each of the lower electrodes 172A and 172B may have a pillar shape extending in the vertical direction (e.g., the third direction Z), but example embodiments are not limited thereto. In some example embodiments, the lower electrodes 172A and 172B may be disposed to overlap the landing pads 160A and 160B in the vertical direction (e.g., the third direction Z). For example, the plurality of lower electrodes 172A and 172B may be spaced apart from each other in the first direction X and the second direction Y and may be arranged in a matrix form.

In some example embodiments, the lower electrodes 172A and 172B may include the first lower electrode 172A and the second lower electrode 172B spaced apart from each other in the first direction X. The first lower electrode 172A may be in contact with or in direct contact with the top surface of the first landing pad 160A, and the second lower electrode 172B may be in contact with the top surface of the second landing pad 160B. Accordingly, the capacitor structures 170A and 170B may include the first capacitor structure 170A and the second capacitor structure 170B arranged along the first direction X.

The capacitor dielectric layer 174 may be interposed between the lower electrodes 172A and 172B and the upper electrode 176. For example, the capacitor dielectric layer 174 may conformally extend along the outer circumferential surfaces of the lower electrodes 172A and 172B and the top surface of the second interlayer insulating layer 116. The upper electrode 176 may be formed on the top surface of the capacitor dielectric layer 174.

In some example embodiments, the upper electrode 176 may be a plate-shaped structure extending along a plane crossing the third direction Z or parallel to an upper surface of the substrate 100. For example, a third interlayer insulating layer 118 may be formed on the capacitor dielectric layer 174 to fill a space between the lower electrodes 172A and 172B. The top surface of the third interlayer insulating layer 118 may be disposed at the same level as the topmost surface of the capacitor dielectric layer 174. The upper electrode 176 may extend along the top surface of the capacitor dielectric layer 174 and the top surface of the third interlayer insulating layer 118. However, this is only for example, and the third interlayer insulating layer 118 may be omitted. As another example, unlike the illustrated example, the upper electrode 176 may be formed on the capacitor dielectric layer 174 to fill the space between the lower electrodes 172A and 172B.

Each of the lower electrodes 172A and 172B and the upper electrode 176 may include doped polysilicon, metal, conductive metal nitride, conductive metal silicide, conductive metal oxide, or a combination thereof. For example, each of the lower electrodes 172A and 172B and the upper electrode 176 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof, but example embodiments are not limited thereto.

The capacitor dielectric layer 174 may include silicon oxide, silicon oxynitride, a high-k material having a higher dielectric constant than silicon oxide, or a combination thereof. The high-k material may include, for example, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide (ZrO$_2$), aluminum oxide (Al$_2$O$_3$), or a combination thereof, but example embodiments are not limited thereto.

In order to reduce a leakage current of a semiconductor memory device, a channel layer including an oxide semiconductor material (e.g., IGZO) has been studied. However, the channel layer including the oxide semiconductor material may have poor interface characteristics with the conductive line (e.g., bit line), which may cause deterioration of the performance of the semiconductor memory device.

However, the semiconductor memory device according to some example embodiments may reduce the leakage current using the channel layer 130 and/or improve interface characteristics with the conductive line 120. For example, as described above, the channel layer 130 may include the first oxide semiconductor layer 132 and the second oxide semiconductor layer 134 sequentially stacked on the conductive line 120. The first oxide semiconductor layer 132 has a relatively large crystallinity, and thus may have high carrier mobility such as a high electron and/or hole mobility, and may improve interface characteristics with the conductive line 120 (e.g., may reduce the interface resistance with the conductive line 120). Alternatively or additionally, the second oxide semiconductor layer 134 may include an amorphous oxide semiconductor material, so that the leakage current may be effectively reduced. Accordingly, a semiconductor memory device with improved performance may be provided.

Figure 5:
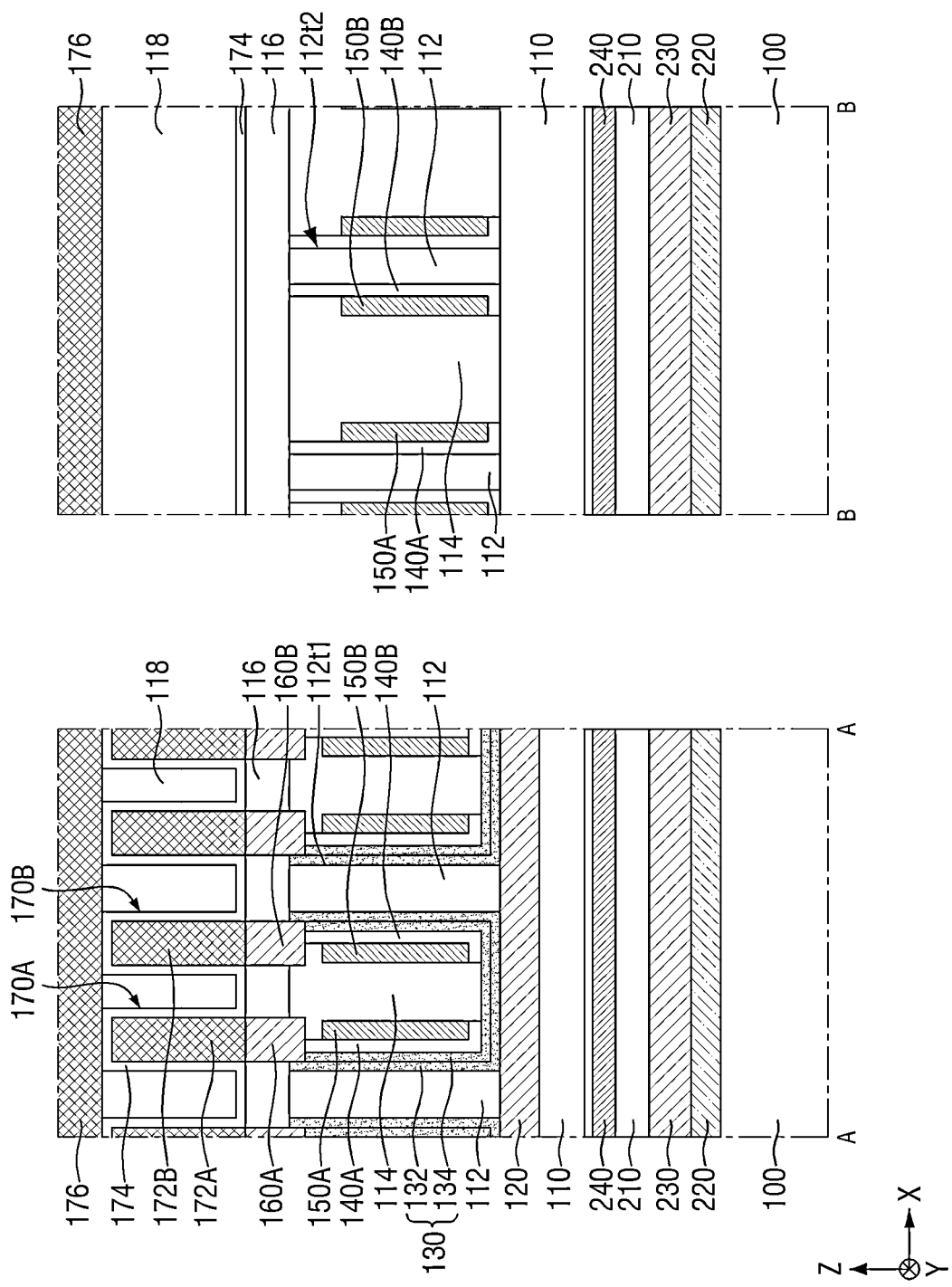
FIGS. 5 and 6 are cross-sectional views illustrating a semiconductor memory device according to some example embodiments.
Figure 6:
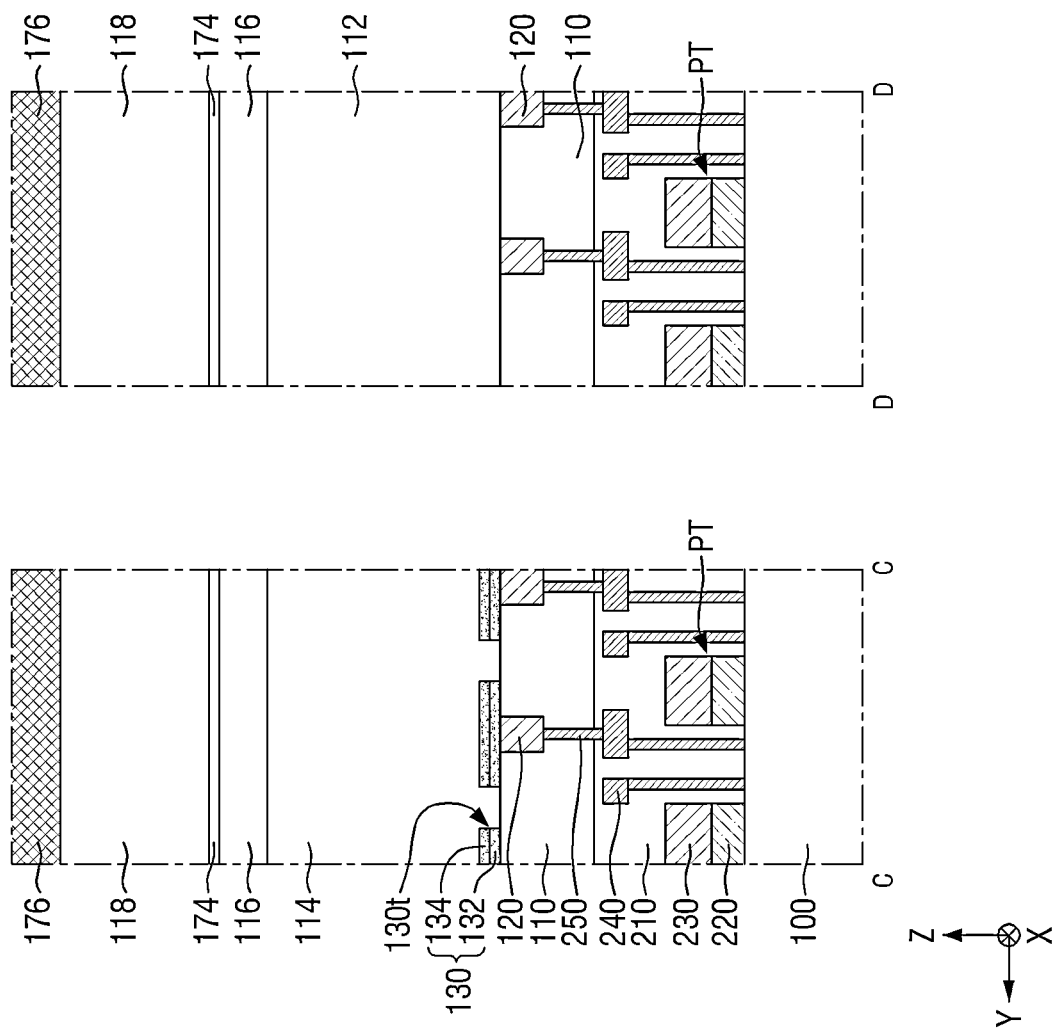

FIGS. 5 and 6 are cross-sectional views illustrating a semiconductor memory device according to some example embodiments. For simplicity of description, redundant parts of the description made with reference to FIGS. 1 to 4 may be recapitulated or omitted.

Referring to FIGS. 5 and 6, the semiconductor memory device according to some example embodiments further includes a peripheral circuit element PT and an inter-wire insulating layer 210.

The peripheral circuit element PT and the inter-wire insulating layer 210 may be formed on the substrate 100. The peripheral circuit element PT may include control elements and dummy elements to control functions of semiconductor memory elements formed on the substrate 100. The inter-wire insulating layer 210 may cover the peripheral circuit element PT.

In some example embodiments, the peripheral circuit element PT may include a first conductive pattern 220 and a second conductive pattern 230 sequentially formed on the top surface of the substrate 100. The first conductive pattern 220 and the second conductive pattern 230 may constitute various circuit elements for controlling functions of semiconductor memory elements. The peripheral circuit element PT may include, for example, not only various active elements such as diodes and/or transistors such as planar transistors, but also various passive elements such as capacitors, resistors, and inductors. The peripheral circuit element PT may include transistors for sense amplifiers and/or row drivers and/or column and row decoders; however, example embodiments are not limited thereto.

In some example embodiments, the peripheral circuit element PT and the inter-wire insulating layer 210 may be disposed under the first interlayer insulating layer 112. For example, the lower insulating layer 110 may be stacked on the top surface of the inter-wire insulating layer 210. The first interlayer insulating layer 112 may be stacked on the top surface of the lower insulating layer 110. For example, the semiconductor memory device according to some example embodiments may have a cell on peri (COP) structure.

In some example embodiments, the peripheral circuit element PT may be connected to the conductive line 120. For example, a wire pattern 240 connected to the peripheral circuit element PT may be formed in the inter-wire insulating layer 210. In addition, a connection via 250 may be formed by penetrating the lower insulating layer 110 to connect the conductive line 120 and the wire pattern 240. Accordingly, the conductive line 120 may be controlled by the peripheral circuit element PT.

Figure 7:
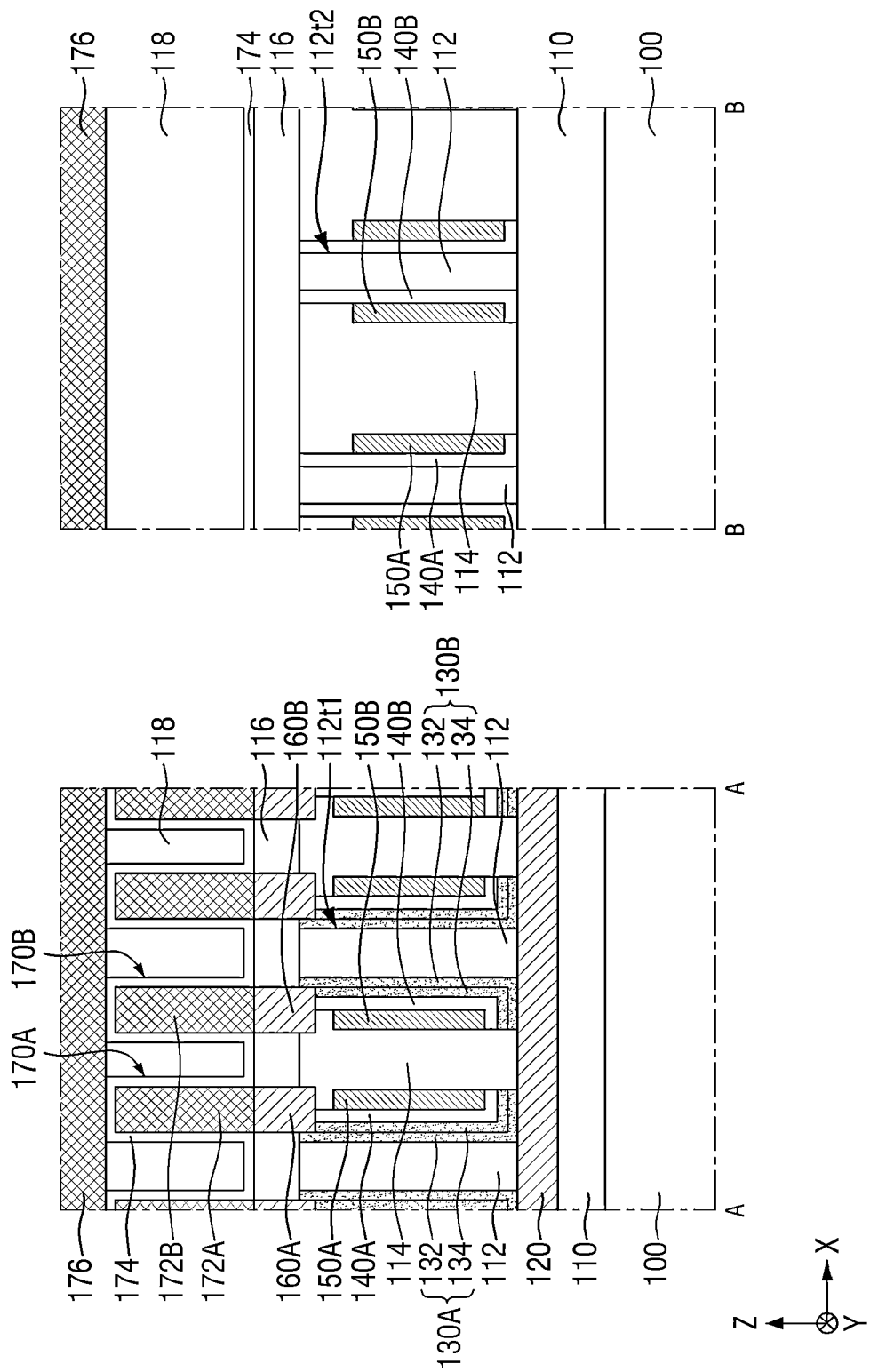
FIG. 7 is a cross-sectional view illustrating a semiconductor memory device according to some example embodiments.

FIG. 7 is a cross-sectional view illustrating a semiconductor memory device according to some example embodiments. For simplicity of description, redundant parts of the description made with reference to FIGS. 1 to 4 may be recapitulated or omitted.

Referring to FIG. 7, the semiconductor memory device according to some example embodiments includes a first channel layer 130A and a second channel layer 130B spaced apart from each other in the first direction X.

For example, the first channel layer 130A may extend along the first side surface of the first channel trench 112t1, and the second channel layer 130B may extend along the second side surface of the first channel trench 112t1. The first channel layer 130A and the second channel layer 130B may face each other in the first channel trench 112t1. The first channel layer 130A and the second channel layer 130B facing each other may implement a structure of transistors facing each other.

In some example embodiments, the first channel layer 130A may extend along the bottom surface and the side surface of the first gate insulating layer 140A, and the second channel layer 130B may extend along the bottom surface and the side surface of the second gate insulating layer 140B. For example, in a cross section crossing the second direction Y, each of the first channel layer 130A and the second channel layer 130B may have an "L" shape.

In some example embodiments, one end of each of the first channel layer 130A and the second channel layer 130B may be continuous with one end of the corresponding gate insulating layers 140A and 140B. For example, one end of the first channel layer 130A extending along the bottom surface of the first gate insulating layer 140A may be continuous with one end of the first gate insulating layer 140A. Alternatively or additionally, for example, one end of the second channel layer 130B extending along the bottom surface of the second gate insulating layer 140B may be continuous with one end of the second gate insulating layer 140B. This may be due to the characteristics of the etching process for forming the first channel layer 130A and the second channel layer 130B.

In some example embodiments, each of the first channel layer 130A and the second channel layer 130B may include the first oxide semiconductor layer 132 and the second oxide semiconductor layer 134 sequentially stacked on the conductive line 120.

Figure 8:
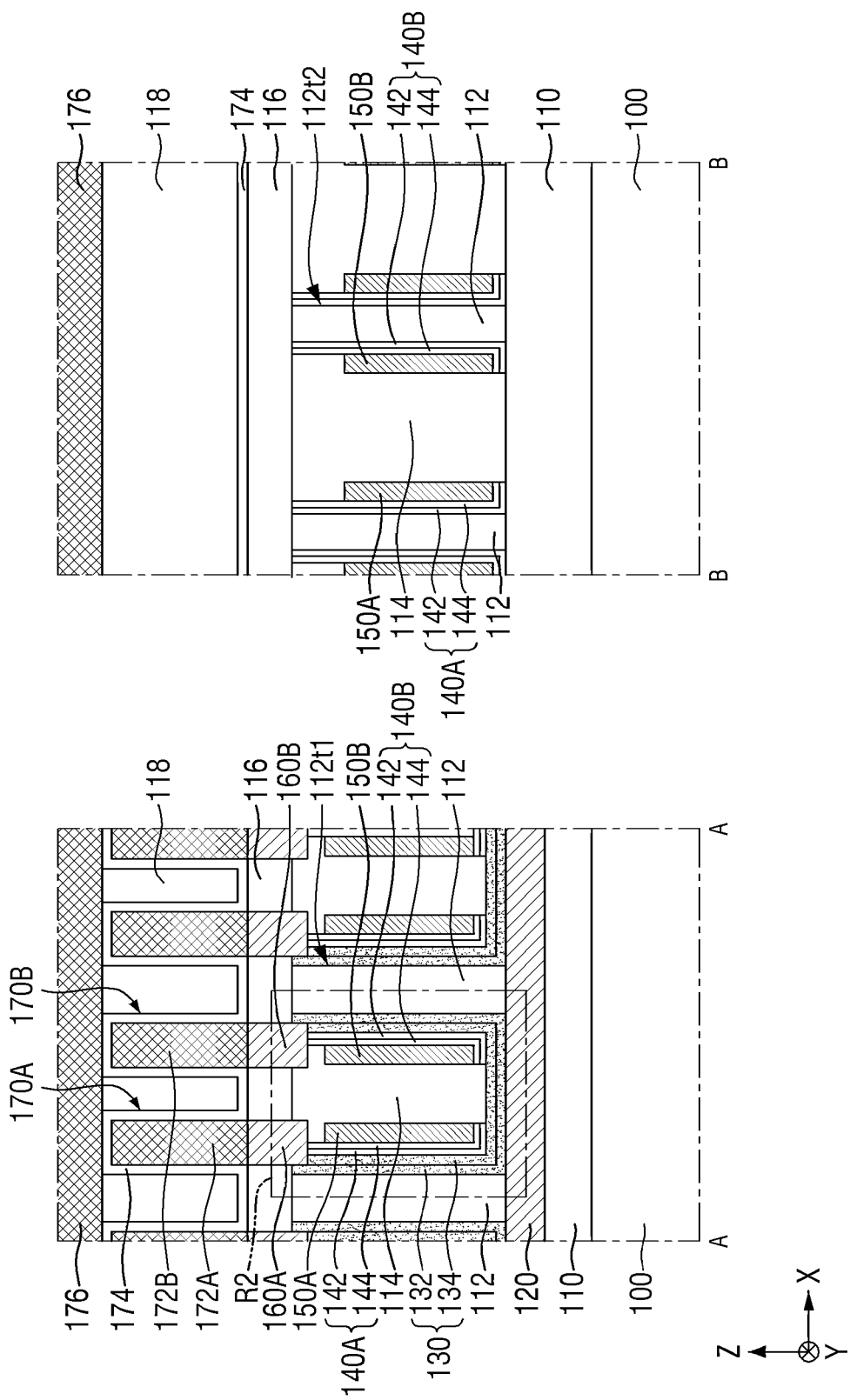
FIG. 8 is a cross-sectional view illustrating a semiconductor memory device according to some example embodiments.
Figure 9A:
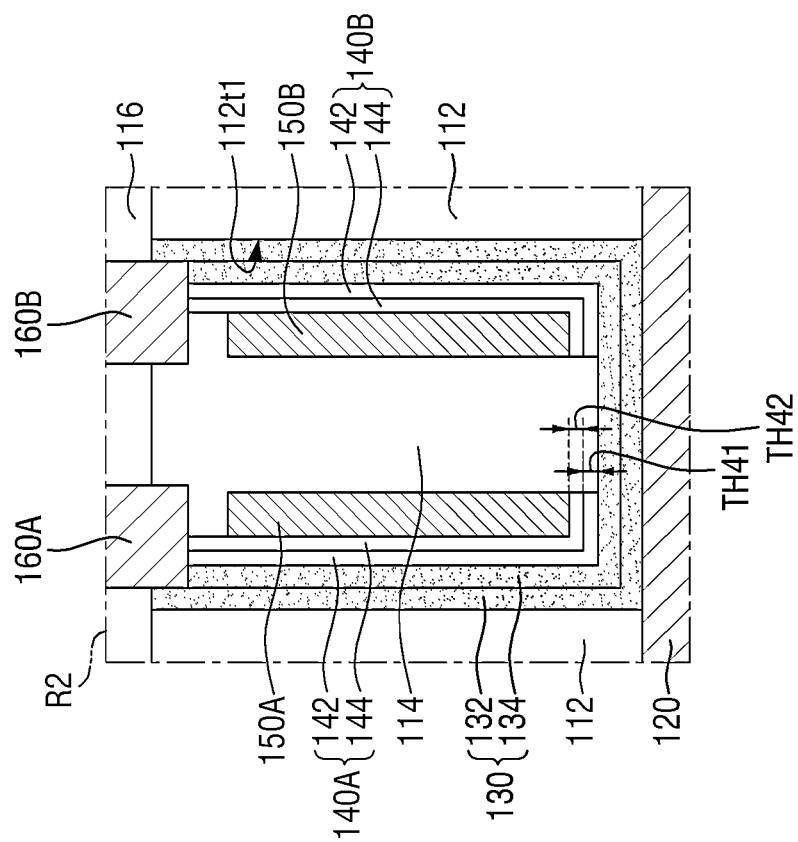
FIGS. 9A and 9B are various enlarged views of region R2 of FIG. 8.
Figure 9B:
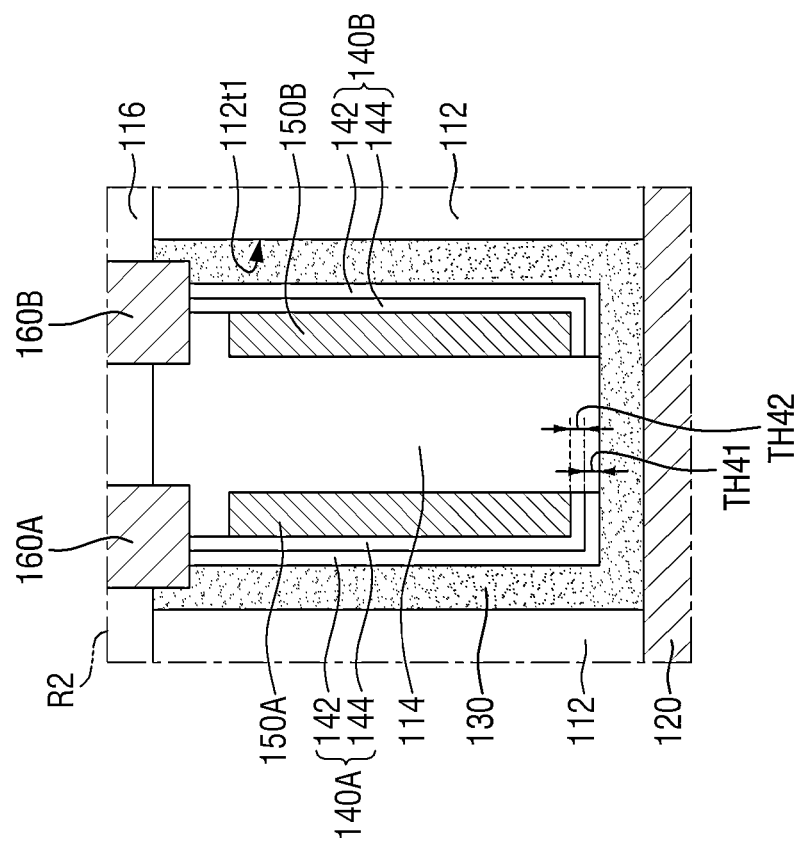

FIG. 8 is a cross-sectional view illustrating a semiconductor memory device according to some example embodiments. FIGS. 9A and 9B are various enlarged views of region R2 of FIG. 8. For simplicity of description, redundant parts of the description made with reference to FIGS. 1 to 4 may be recapitulated or omitted.

Referring to FIGS. 8 to 9A, in the semiconductor memory device according to some example embodiments, each of the gate insulating layers 140A and 140B includes a first dielectric layer 142 and a second dielectric layer 144 sequentially stacked on the channel layer 130.

For example, the first dielectric layer 142 may extend conformally along the channel layer 130. The first dielectric layer 142 may be in contact with the channel layer 130. The second dielectric layer 144 may be formed on the first dielectric layer 142. The second dielectric layer 144 may conformally extend on the first dielectric layer 142.

Although it is only illustrated that a thickness TH41 of the first dielectric layer 142 and a thickness TH42 of the second dielectric layer 144 are the same, this is only for example. Unlike the illustrated example, the thickness TH41 of the first dielectric layer 142 may be smaller than or greater than the thickness TH42 of the second dielectric layer 144.

In some example embodiments, the second dielectric layer 144 may have a higher dielectric constant than the first dielectric layer 142. For example, the first dielectric layer 142 may include silicon oxide and/or silicon oxynitride having a relatively small dielectric constant, and the second dielectric layer 144 may include a high-k material having a relatively large dielectric constant. The high-k material may include, for example, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide ($ZrO_2$), aluminum oxide ($Al_2O_3$), or a combination thereof, but is not limited thereto. For example, the first dielectric layer 142 may include silicon oxide, and the second dielectric layer 144 may include at least one of aluminum oxide and hafnium oxide.

The first dielectric layer 142 including a material having a relatively small dielectric constant such as silicon oxide may have few defects such as a relatively few amount of areas for electron and/or hole trapping, and thus reliability of the semiconductor memory device according to some example embodiments may be improved. The second dielectric layer 144 including a material having a relatively large dielectric constant such as aluminum oxide and hafnium oxide may effectively control the leakage current, and in a subsequent process (e.g., due to hydrogen (H) penetration or the like), it is possible to prevent or reduce the likelihood of the quality of the gate insulating layers 140A and 140B from deteriorating. Accordingly, a semiconductor memory device with much improved performance may be provided.

Referring to FIGS. 8 and 9B, in the semiconductor memory device according to some example embodiments, the channel layer 130 may be formed as a single layer.

The channel layer 130 formed as a single layer may include an oxide semiconductor material. In some example embodiments, the channel layer 130 may include an oxide semiconductor material including indium (In). For example, the channel layer 130 may include at least one of IGZO, IGSO, ITZO, IZO, HIZO, IGO, and a combination thereof.

In some example embodiments, the channel layer 130 may be one of the first oxide semiconductor layer 132 and the second oxide semiconductor layer 134 described above with reference to FIGS. 1 to 4.

Figure 10:
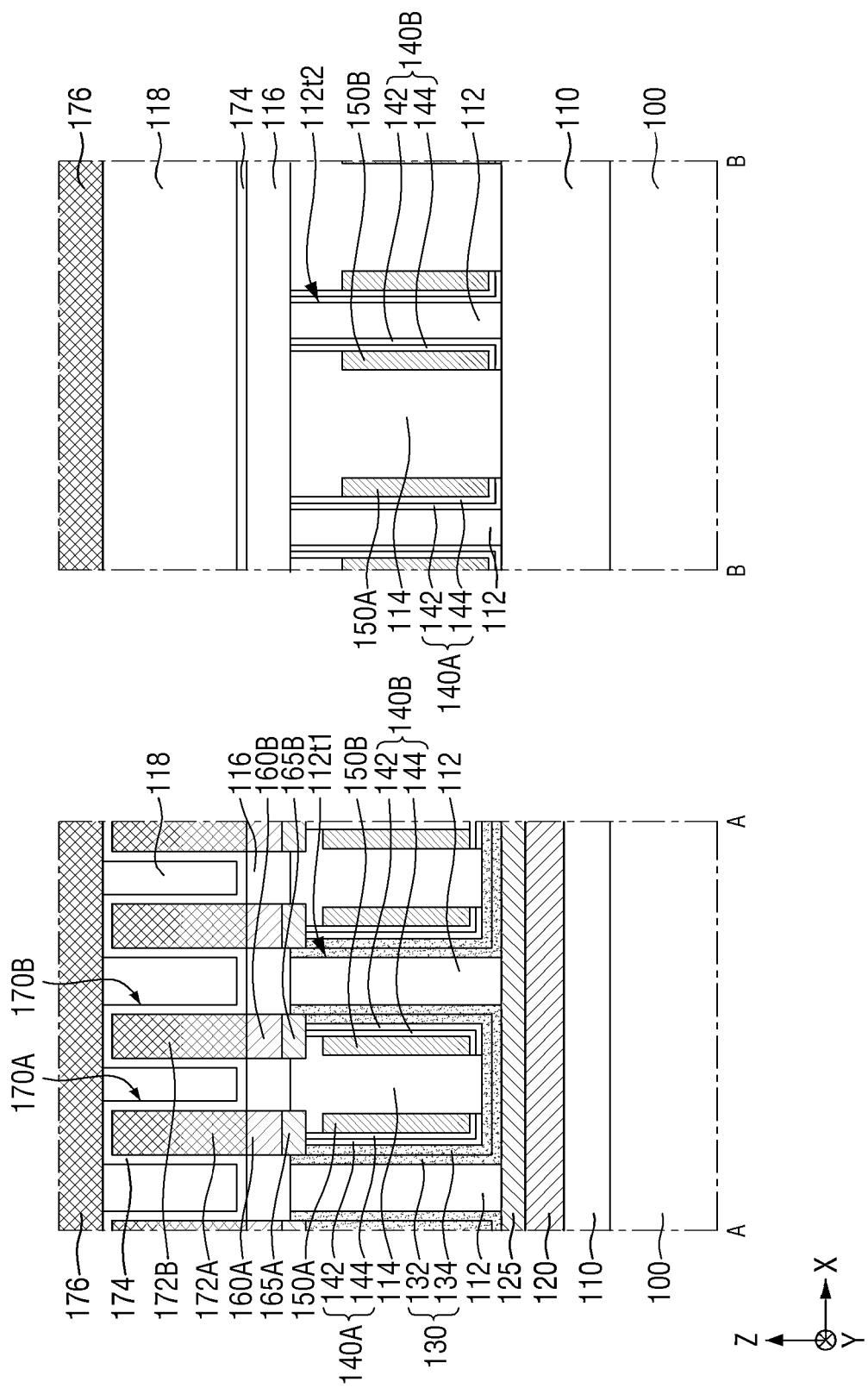
FIG. 10 is a cross-sectional view illustrating a semiconductor memory device according to some example embodiments.

FIG. 10 is a cross-sectional view illustrating a semiconductor memory device according to some example embodiments. For simplicity of description, redundant parts of the description made with reference to FIGS. 1 to 4 may be recapitulated or omitted.

Referring to FIG. 10, the semiconductor memory device according to some example embodiments further includes a contact line 125 and contact patterns 165A and 165B.

The contact line 125 may be interposed between the conductive line 120 and the channel layer 130. For example, the contact line 125 may extend along the top surface of the conductive line 120. A part of the channel layer 130 extending along the bottom surface of the first channel trench 112t1 may be in contact with the top surface of the contact line 125.

The contact line 125 may include a material having superior interface characteristics with the channel layer 130 compared to the conductive line 120. For example, the contact line 125 may include at least one of ITO, titanium (Ti), and tantalum (Ta), but is not limited thereto.

The contact patterns 165A and 165B may be interposed between the channel layer 130 and the landing pads 160A and 160B. For example, the contact patterns 165A and 165B may be in contact with the upper portion of the channel layer 130. The landing pads 160A and 160B may be disposed on the top surfaces of the contact patterns 165A and 165B.

In some example embodiments, the contact patterns 165A and 165B may include the first contact pattern 165A and the second contact pattern 165B spaced apart from each other in the first direction X. The first contact pattern 165A may connect the channel layer 130 to the first landing pad 160A, and the second contact pattern 165B may connect the channel layer 130 to the second landing pad 160B.

The contact patterns 165A and 165B may include a material having improved/superior interface characteristics with the channel layer 130 compared to the landing pads 160A and 160B. For example, the contact patterns 165A and 165B may include at least one of ITO, titanium (Ti), and tantalum (Ta), but are not limited thereto.

In FIG. 10, only the semiconductor memory device including both the contact line 125 and the contact patterns 165A and 165B has been described, but this is only for example. In another example, any one of the contact line 125 and the contact patterns 165A and 165B may be omitted.

Hereinafter, a method for fabricating a semiconductor memory device according to some example embodiments will be described with reference to FIGS. 1 to 34.

FIGS. 11 to 31 are views illustrating intermediate steps for explaining a method for fabricating a semiconductor memory device according to some example embodiments. For simplicity of description, redundant parts of the description made with reference to FIGS. 1 to 10 may be recapitulated or omitted.

Figure 11:
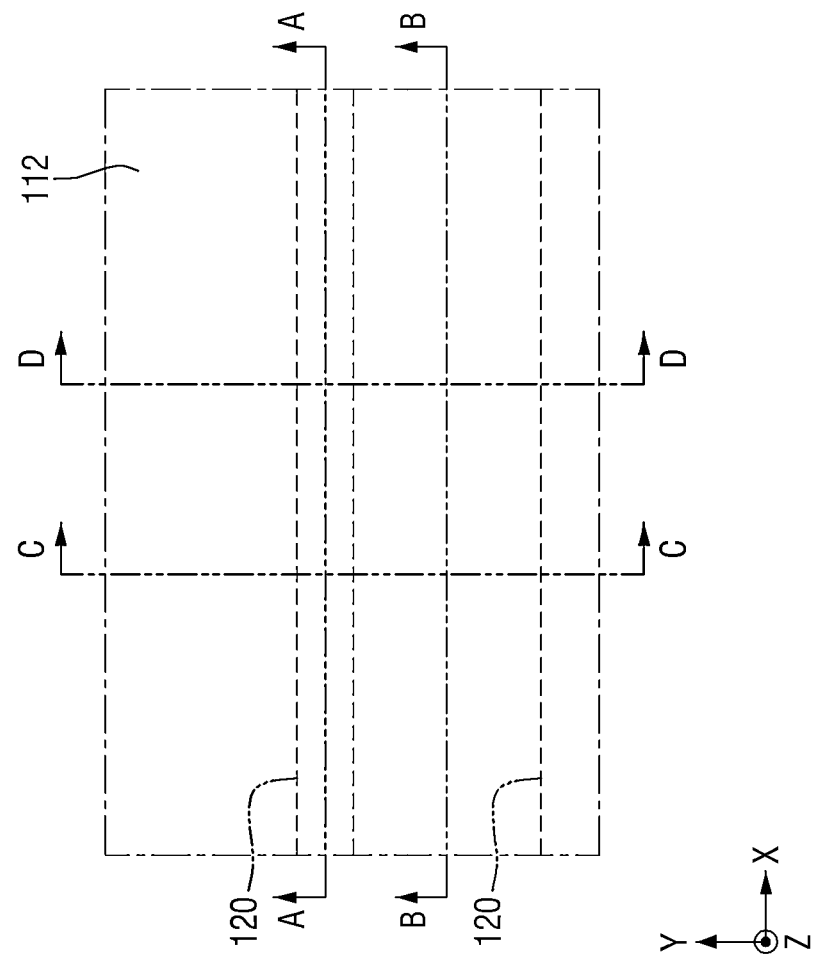
FIGS. 11 to 31 are views illustrating intermediate steps for explaining a method for fabricating a semiconductor memory device according to some example embodiments.
Figure 12:
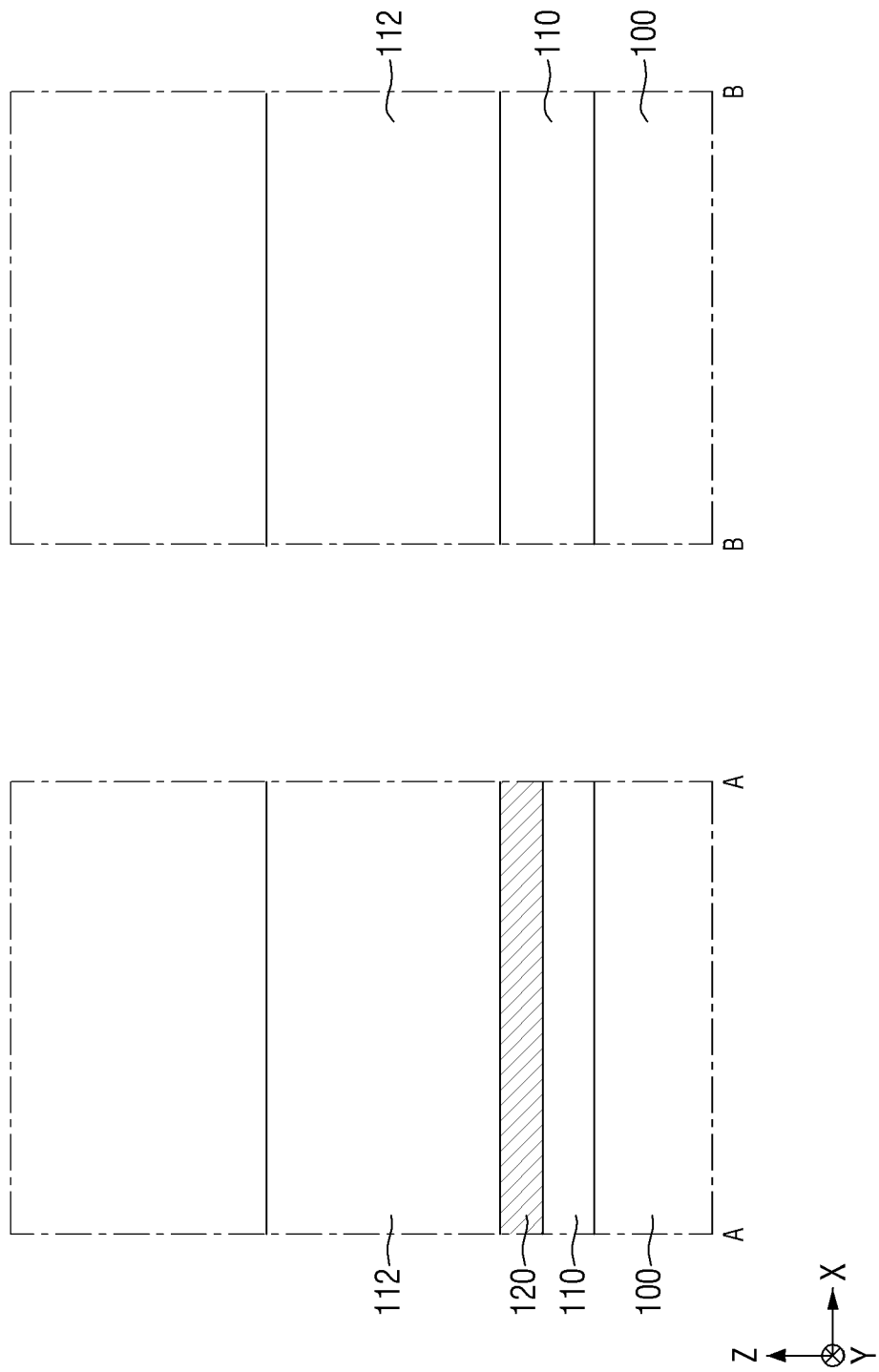
Figure 13:
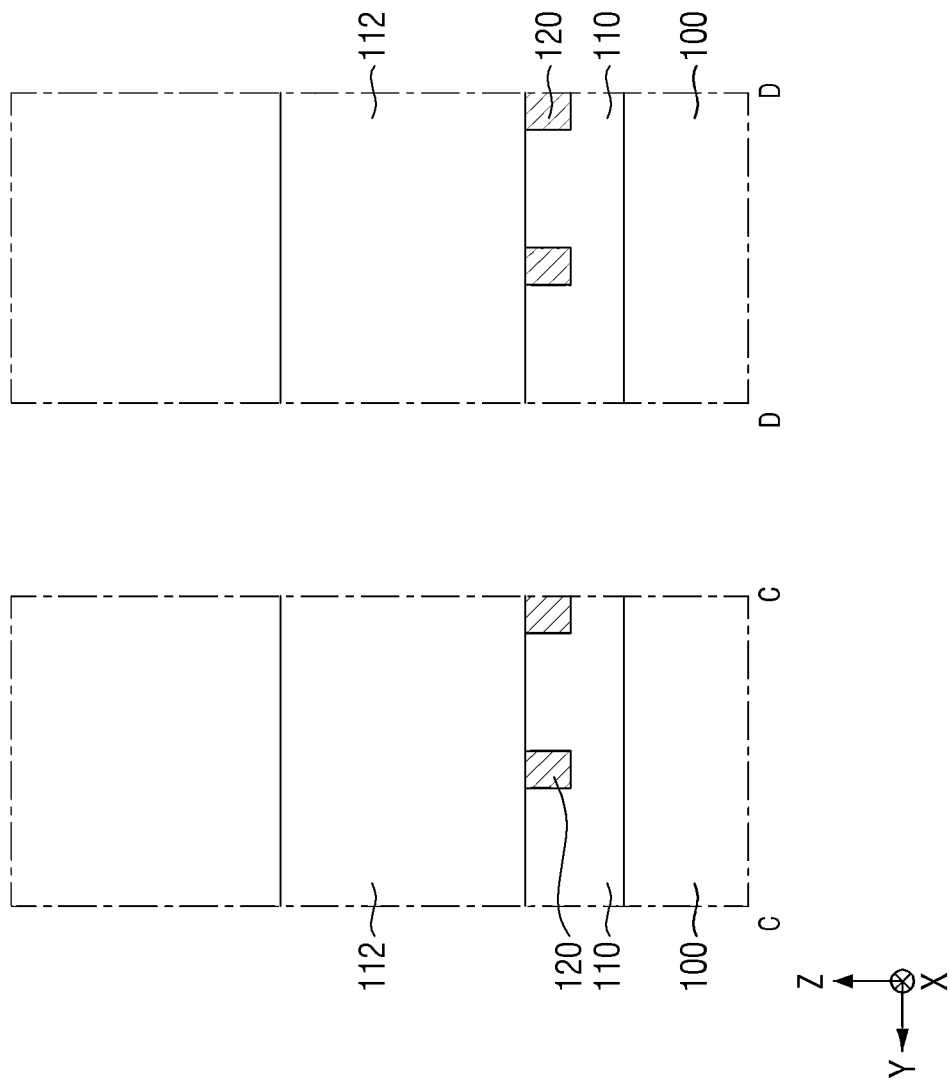

Referring to FIGS. 11 to 13, the conductive line 120 and the first interlayer insulating layer 112 are formed on the substrate 100. For reference, FIG. 12 is a cross-sectional view taken along lines A-A and B-B of FIG. 11, and FIG. 13 is a cross-sectional view taken along lines C-C and D-D of FIG. 11.

For example, the lower insulating layer 110 may be formed on the substrate 100, and the conductive line 120 may be formed on the lower insulating layer 110. Either or both the lower insulating layer 110 and the conductive line 120 may be formed with a deposition process, such as a chemical vapor deposition (CVD) process and/or a physical vapor deposition (PVD) process. Alternatively or additionally the conductive line 120 may be formed with an electrochemical deposition process. The conductive line 120 may be elongated in the first direction X. The plurality of conductive lines 120 may each extend in the first direction X, and may be spaced apart at equal intervals in the second direction Y crossing the first direction X.

The first interlayer insulating layer 112 may be formed on the lower insulating layer 110. The first interlayer insulating layer 112 may cover the top surface of the lower insulating layer 110 and the top surface of the conductive line 120.

Figure 14:
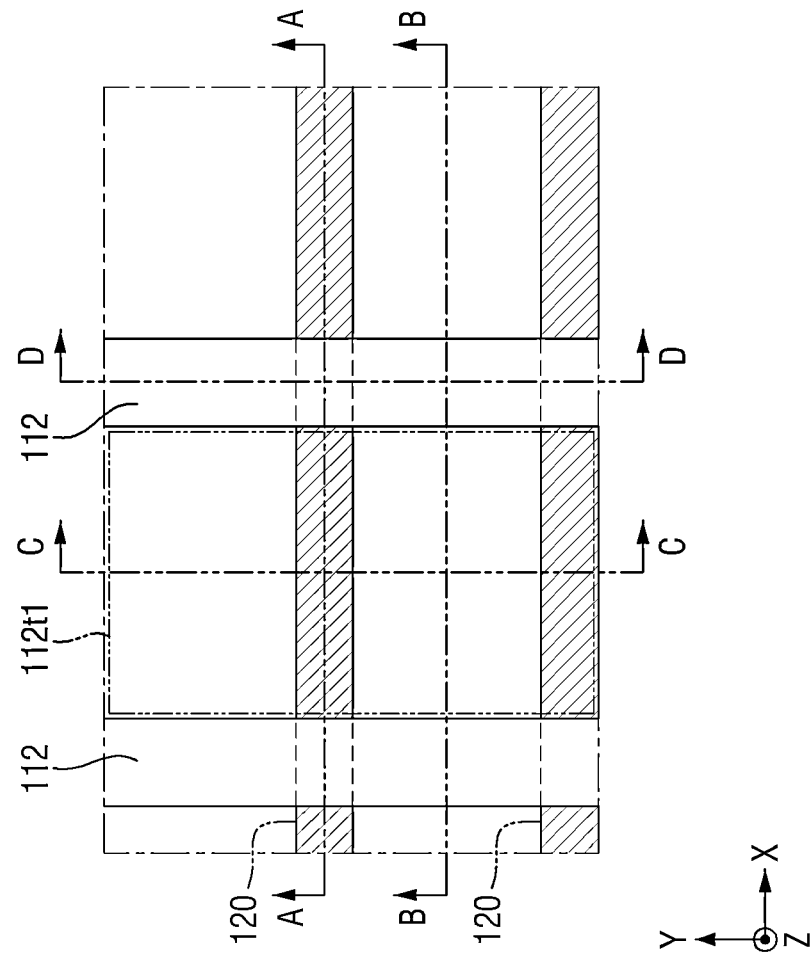
Figure 15:
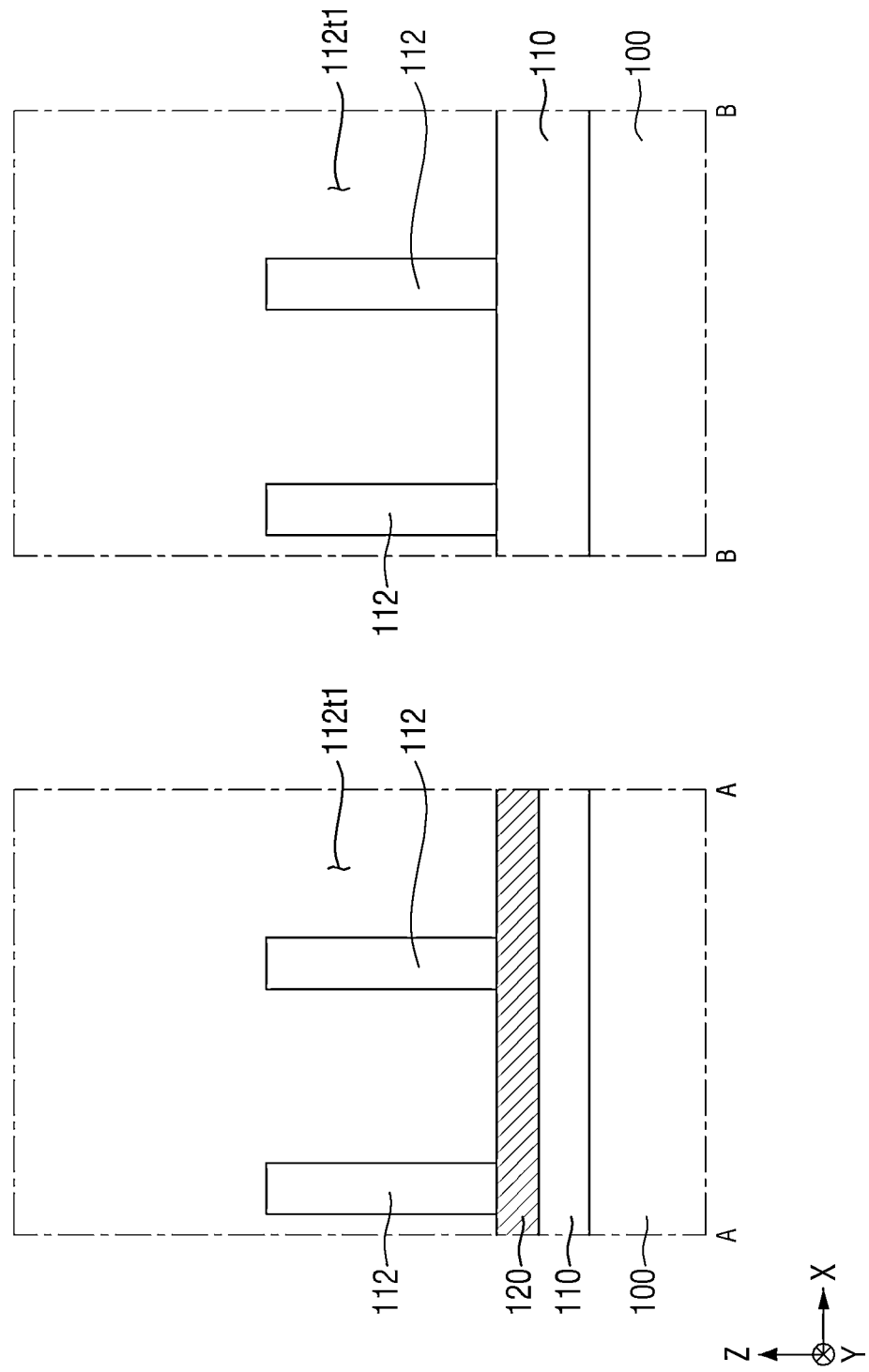
Figure 16:
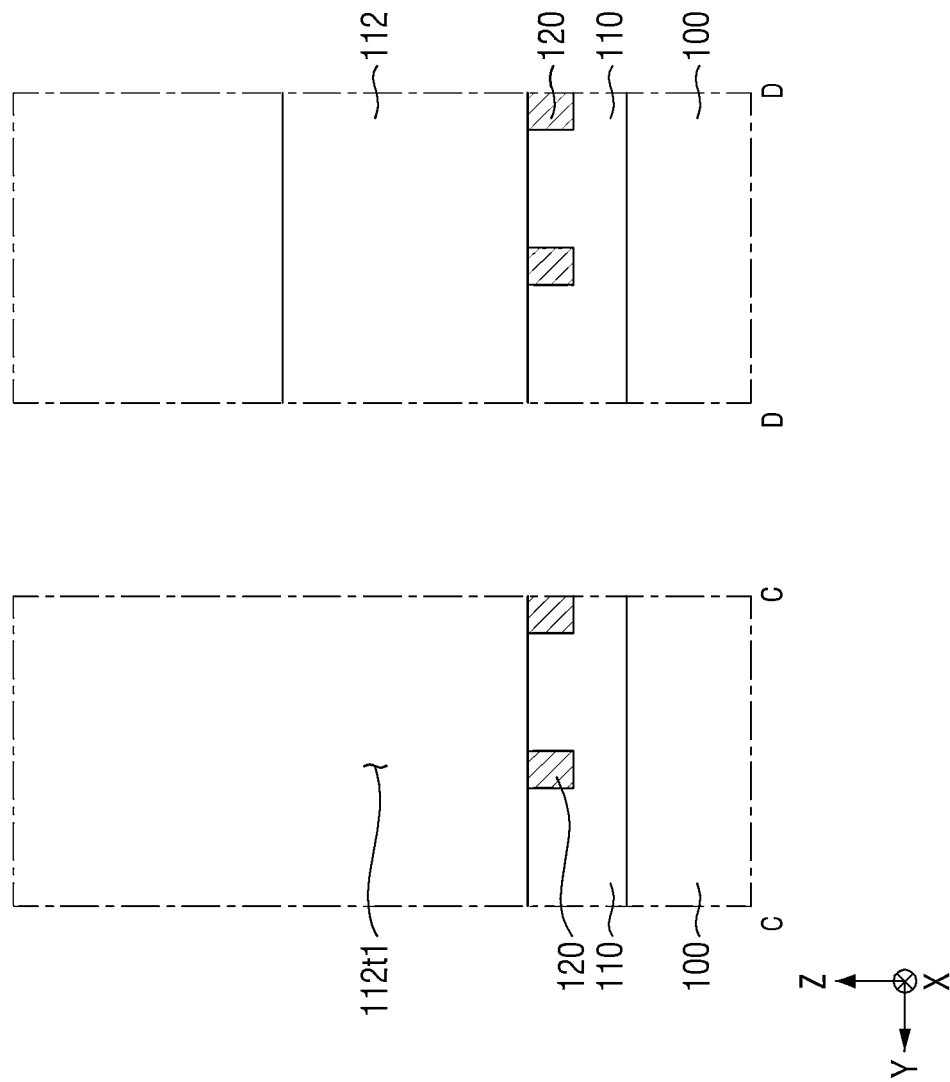

Referring to FIGS. 14 to 16, the first channel trench 112t1 is formed in the first interlayer insulating layer 112. For reference, FIG. 15 is a cross-sectional view taken along lines A-A and B-B of FIG. 14, and FIG. 16 is a cross-sectional view taken along lines C-C and D-D of FIG. 14. The first channel trench 112t1 may be formed with an etching process such as at least one of a wet etch or a dry etch process.

The first channel trench 112t1 may be elongated in the second direction Y to cross the conductive line 120. The plurality of first channel trenches 112t1 may each extend in the second direction Y and may be spaced apart at equal intervals in the first direction X. The bottom surface of the first channel trench 112t1 may expose a part of the top surface of the conductive line 120. Accordingly, a plurality of insulating patterns (the first interlayer insulating layer 112) may be formed to be spaced apart from each other by the first channel trench 112t1 while extending in the second direction Y.

Figure 17:
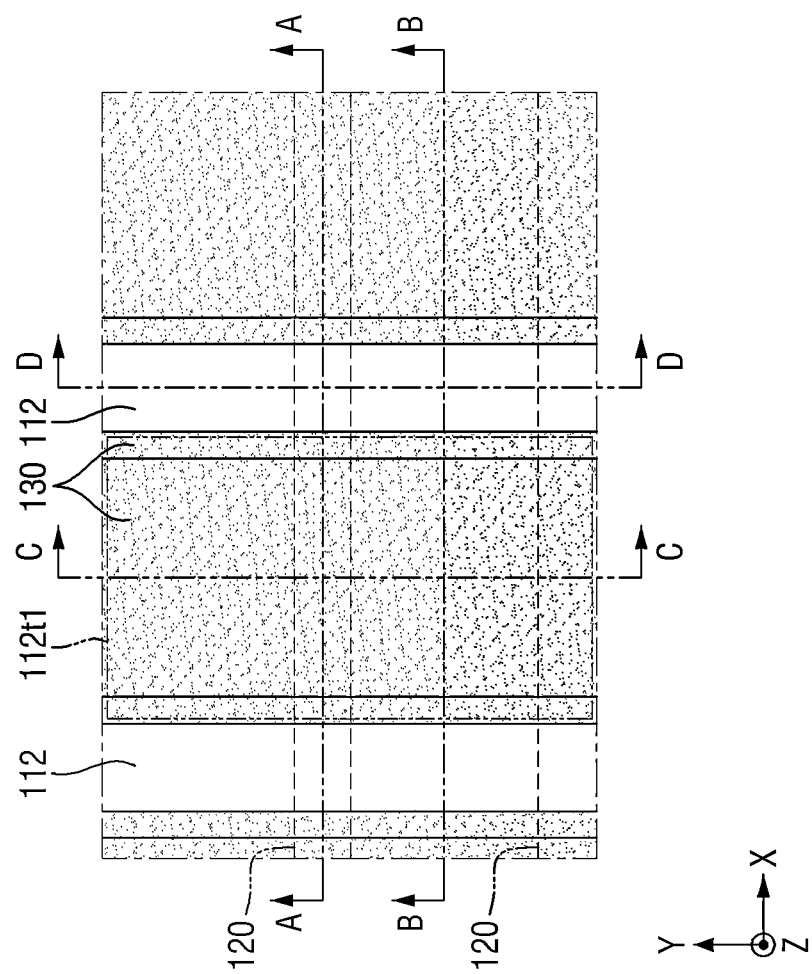
Figure 18:
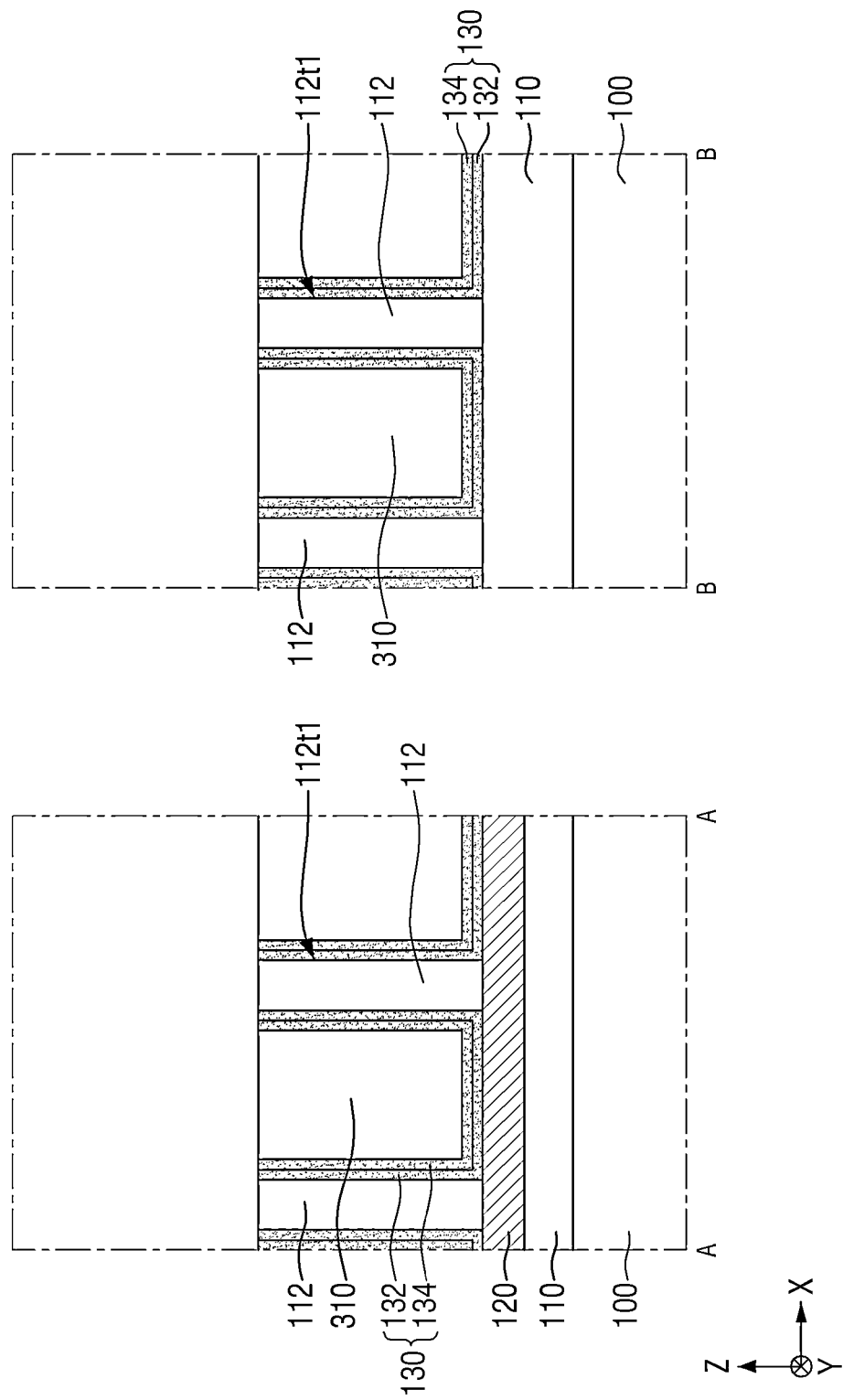
Figure 19:
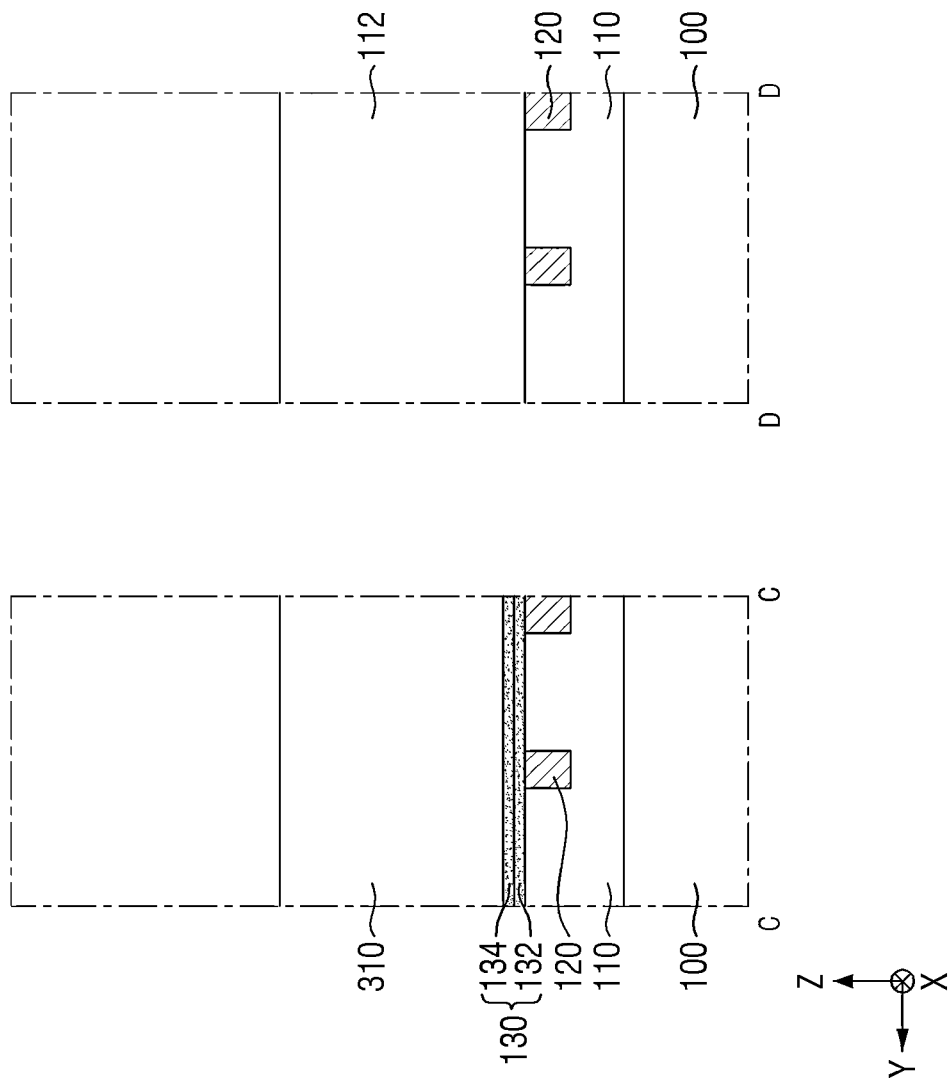

Referring to FIGS. 17 to 19, the channel layer 130 is formed in the first channel trench 112t1. For reference, FIG. 18 is a cross-sectional view taken along lines A-A and B-B of FIG. 17, and FIG. 19 is a cross-sectional view taken along lines C-C and D-D of FIG. 17.

For example, an oxide semiconductor layer conformally extended along the conductive line 120 and the first interlayer insulating layer 112, may be formed. The oxide semiconductor layer may be formed by, for example, an atomic layer deposition (ALD) process, but example embodiments are not limited thereto.

Subsequently, a sacrificial layer 310 may be formed on the channel layer 130. The sacrificial layer 310 may be formed to fill the first channel trench 112t1. Subsequently, a planarization process of exposing the top surface of the first interlayer insulating layer 112 may be performed. Accordingly, the channel layer 130 extending along the profile of the first channel trench 112t1 may be formed. In addition, the plurality of channel layers 130 spaced apart from each other by the first interlayer insulating layer 112 and arranged along the first direction X may be formed. The planarization process may include, for example, a chemical mechanical polishing (CMP) process and/or an etch back process, but example embodiments are not limited thereto.

In some example embodiments, the channel layer 130 may include the first oxide semiconductor layer 132 and the second oxide semiconductor layer 134 sequentially stacked on the conductive line 120. For example, the first oxide semiconductor layer 132 may be formed to conformally extend along the conductive line 120 and the first interlayer insulating layer 112. Subsequently, the second oxide semiconductor layer 134 extending conformally along the first oxide semiconductor layer 132 may be formed.

In some example embodiments, the first oxide semiconductor layer 132 may have a greater crystallinity than the second oxide semiconductor layer 134. For example, the first oxide semiconductor layer 132 may include a crystalline or semi-crystalline oxide semiconductor material, and the second oxide semiconductor layer 134 may include an amorphous oxide semiconductor material. The crystallinity may be determined, for example, by a TEM process and/or an XRD process; however, example embodiments are not limited thereto.

Figure 20:
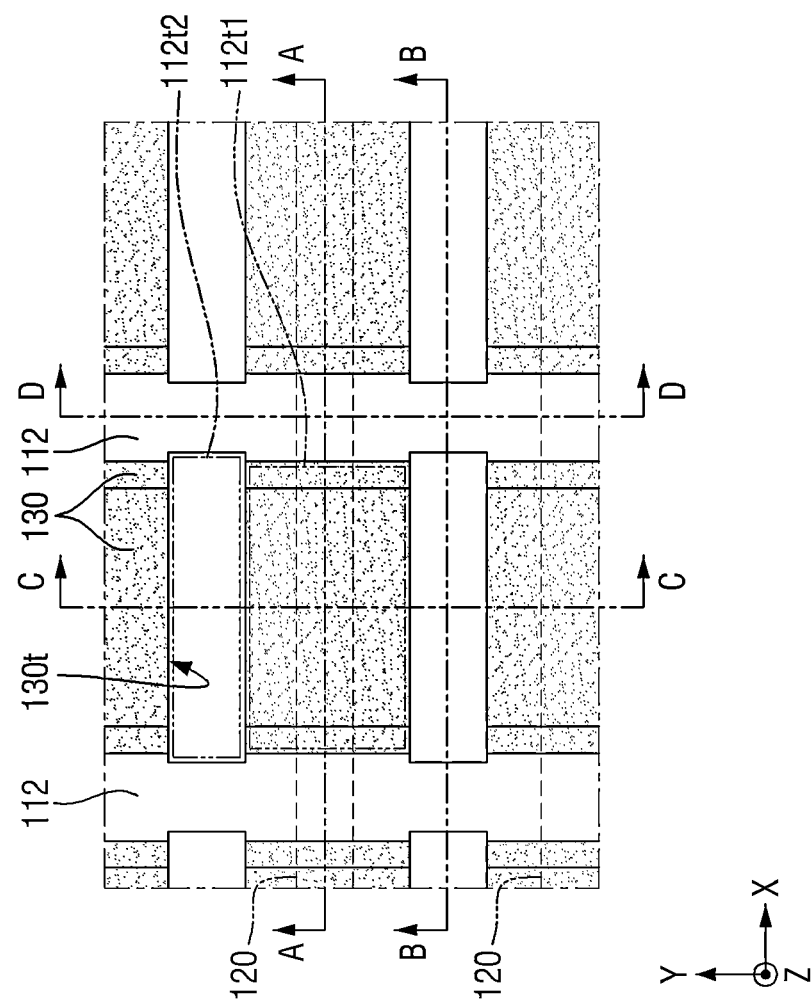
Figure 21:
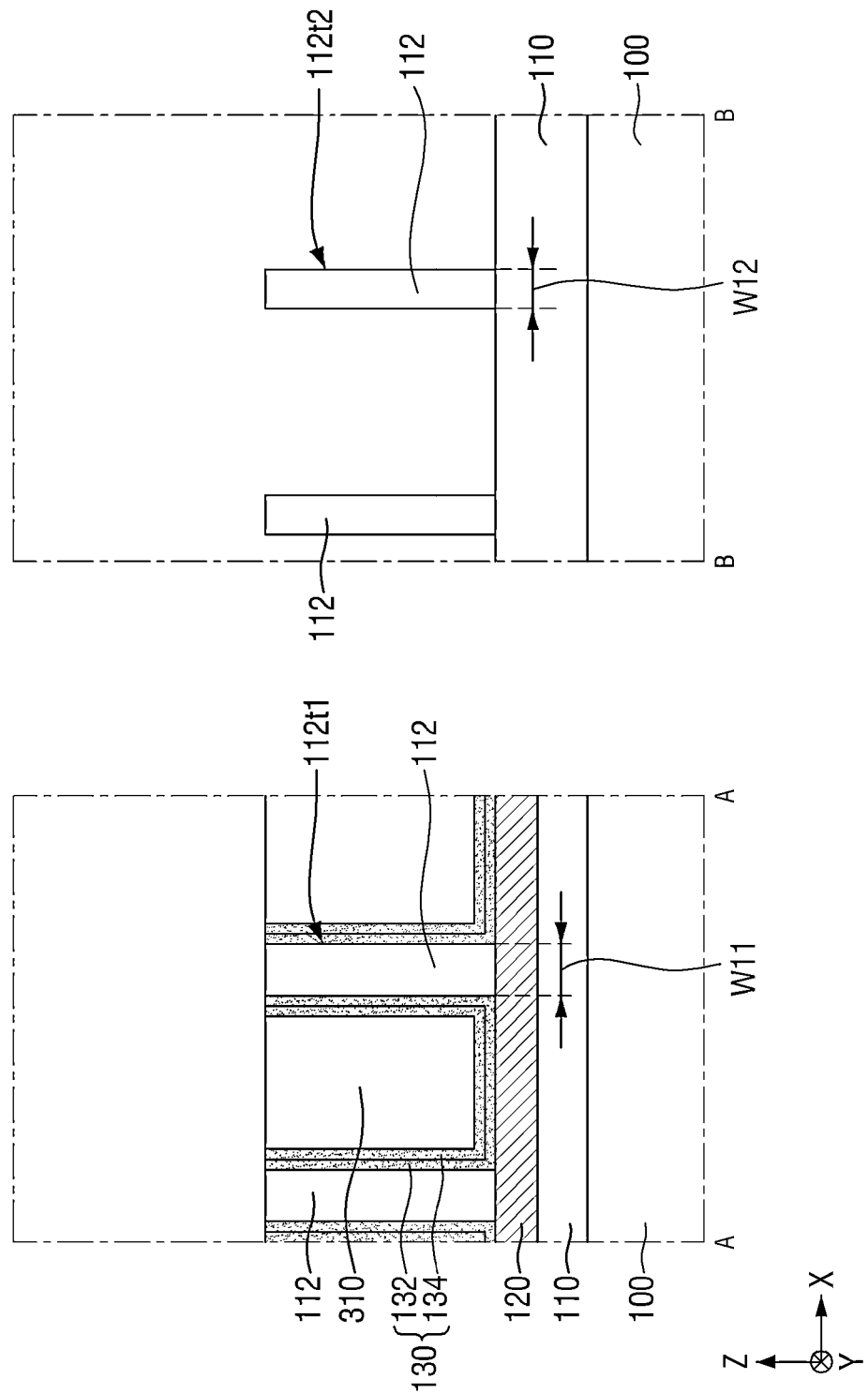
Figure 22:
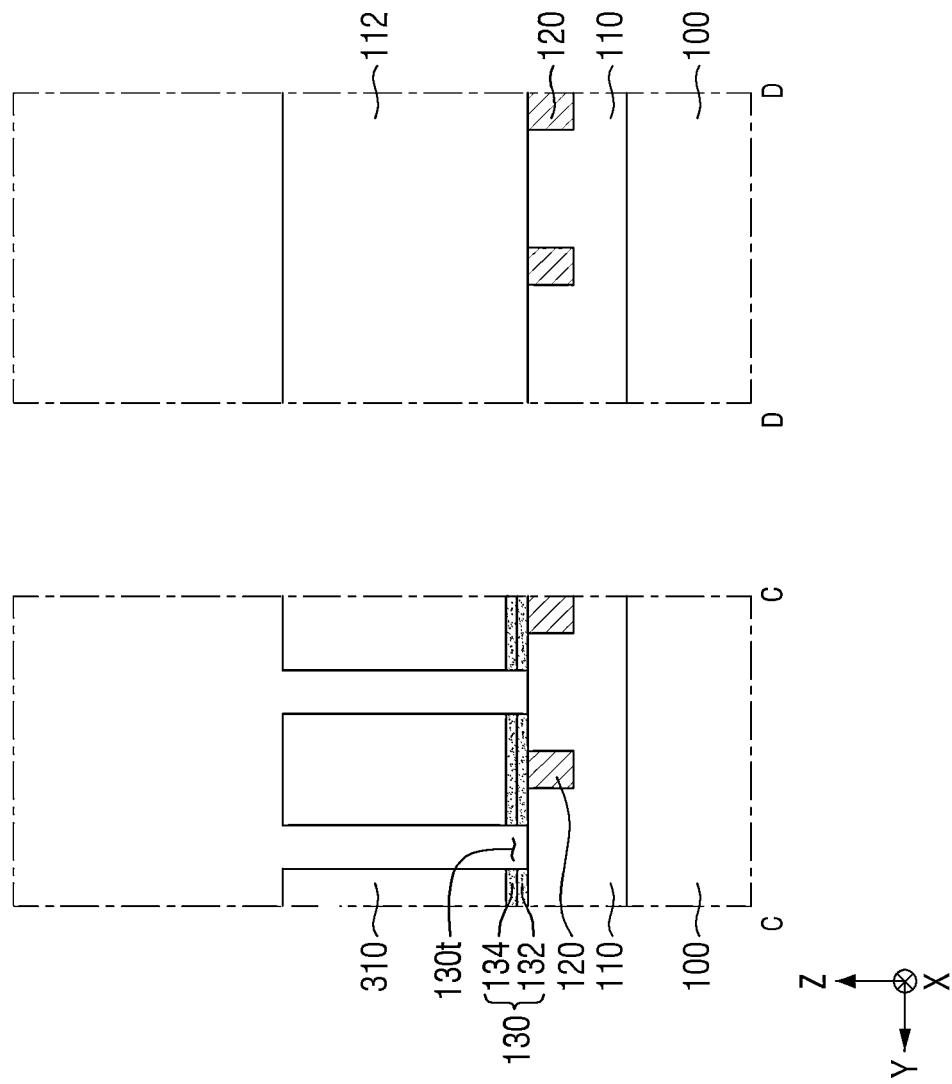

Referring to FIGS. 20 to 22, the separation trench 130t for cutting the channel layer 130 is formed. For reference, FIG. 21 is a cross-sectional view taken along lines A-A and B-B of FIG. 20, and FIG. 22 is a cross-sectional view taken along lines C-C and D-D of FIG. 20.

The separation trench 130t may be formed by patterning the sacrificial layer 310 and the channel layer 130. The separation trench 130t may extend in the first direction X and may cut the channel layer 130 extending in the second direction Y within the first channel trench 112t1. Accordingly, the plurality of channel layers 130 may be spaced apart from each other in the first direction X and the second direction Y and may be arranged in a matrix form. Patterning of the sacrificial layer 310 and the channel layer 130 may be performed by, for example, a dry etching process, but is not limited thereto. After forming the separation trench 130t, the sacrificial layer 310 may be removed, e.g. may be etched and/or ashed for removal.

In some example embodiments, the second channel trench 112t2 may be formed in the first interlayer insulating layer 112. The second channel trench 112t2 may be drawn from the side surface of the first interlayer insulating layer 112. Accordingly, the width W11 of the first interlayer insulating layer 112 defined by the first channel trench 112t1 may be greater than the width W12 of the filling insulating layer 114 defined by the second channel trench 112t2. For example, patterning of the sacrificial layer 310 and the channel layer 130 may be performed to overlap a part of the first interlayer insulating layer 112. Accordingly, the channel layer 130 may be completely cut.

Figure 23:
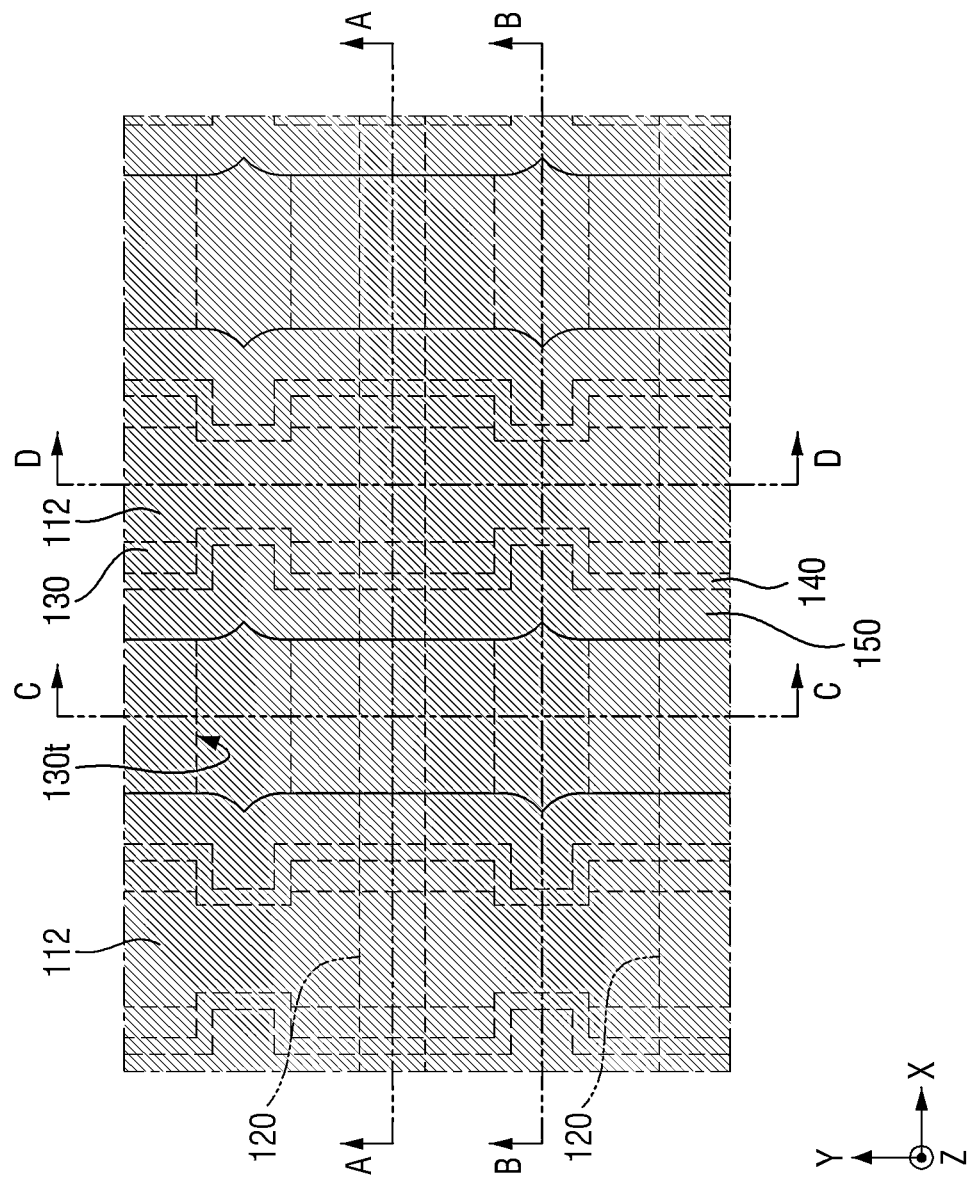
Figure 24:
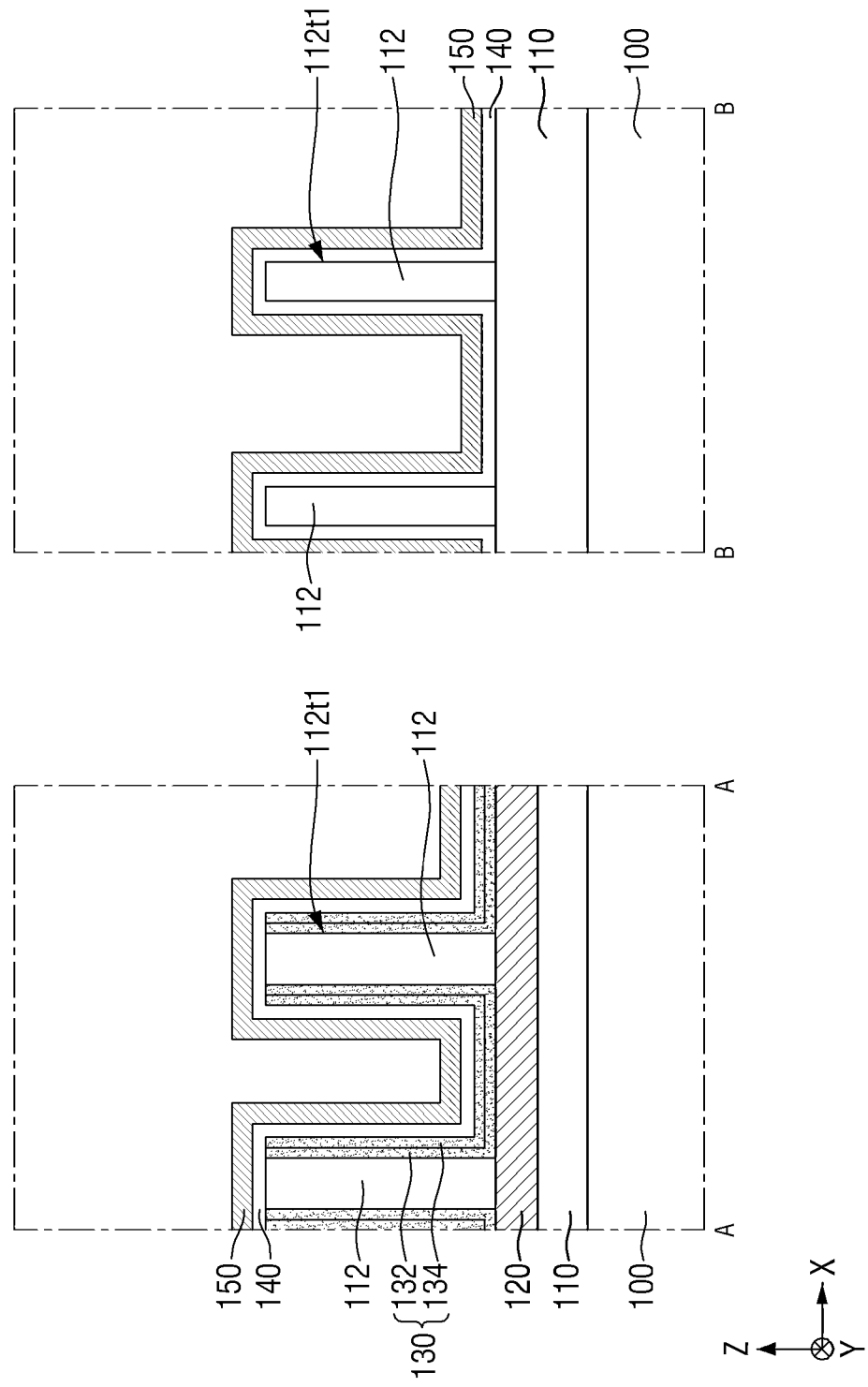
Figure 25:
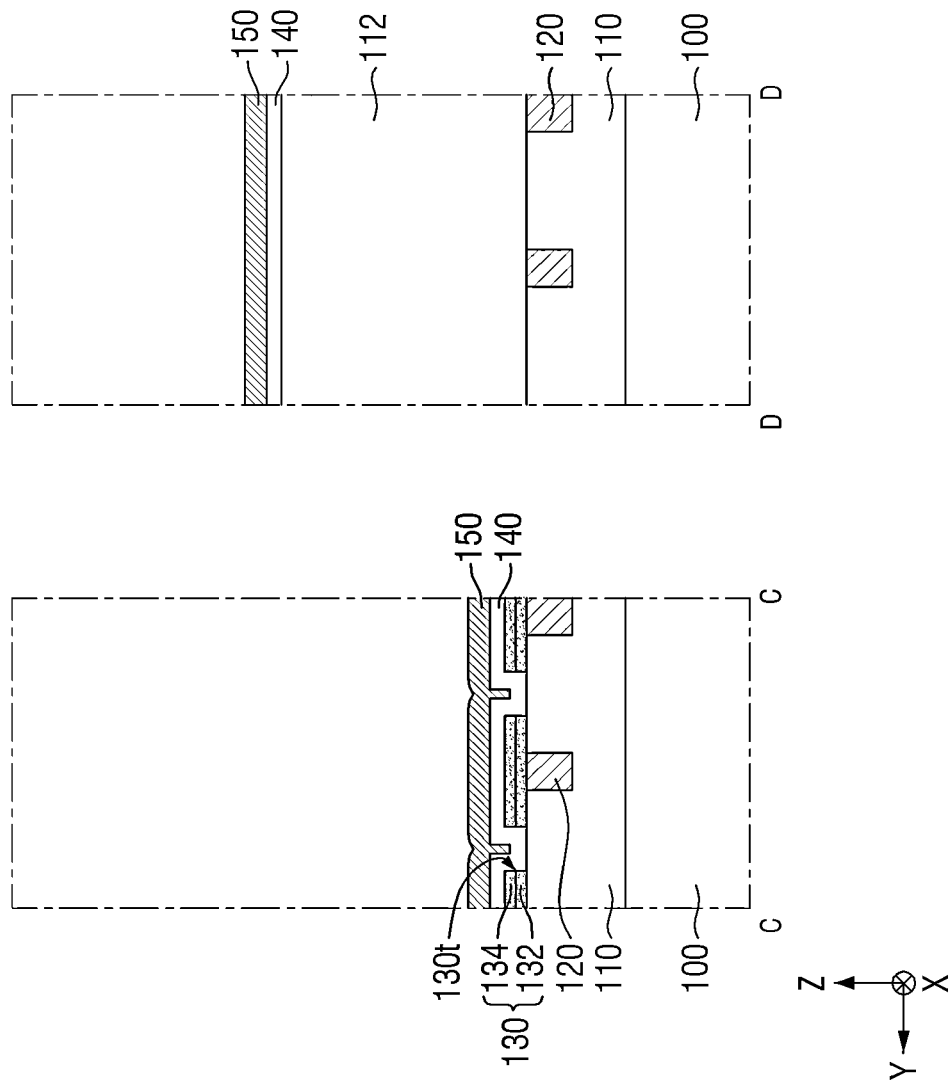

Referring to FIGS. 23 to 25, a preliminary gate insulating layer 140 and a preliminary gate electrode layer 150 are sequentially formed on the channel layer 130. For reference, FIG. 24 is a cross-sectional view taken along lines A-A and B-B of FIG. 23, and FIG. 25 is a cross-sectional view taken along lines C-C and D-D of FIG. 23.

For example, each of the preliminary gate insulating layer 140 and the preliminary gate electrode layer 150 may extend conformally along the channel layer 130. The preliminary gate insulating layer 140 may include silicon oxide, silicon oxynitride, a high-k material having a higher dielectric constant than silicon oxide, or a combination thereof. The preliminary gate electrode layer 150 may include doped polysilicon, metal, conductive metal nitride, conductive metal silicide, conductive metal oxide, or a combination thereof.

Figure 26:
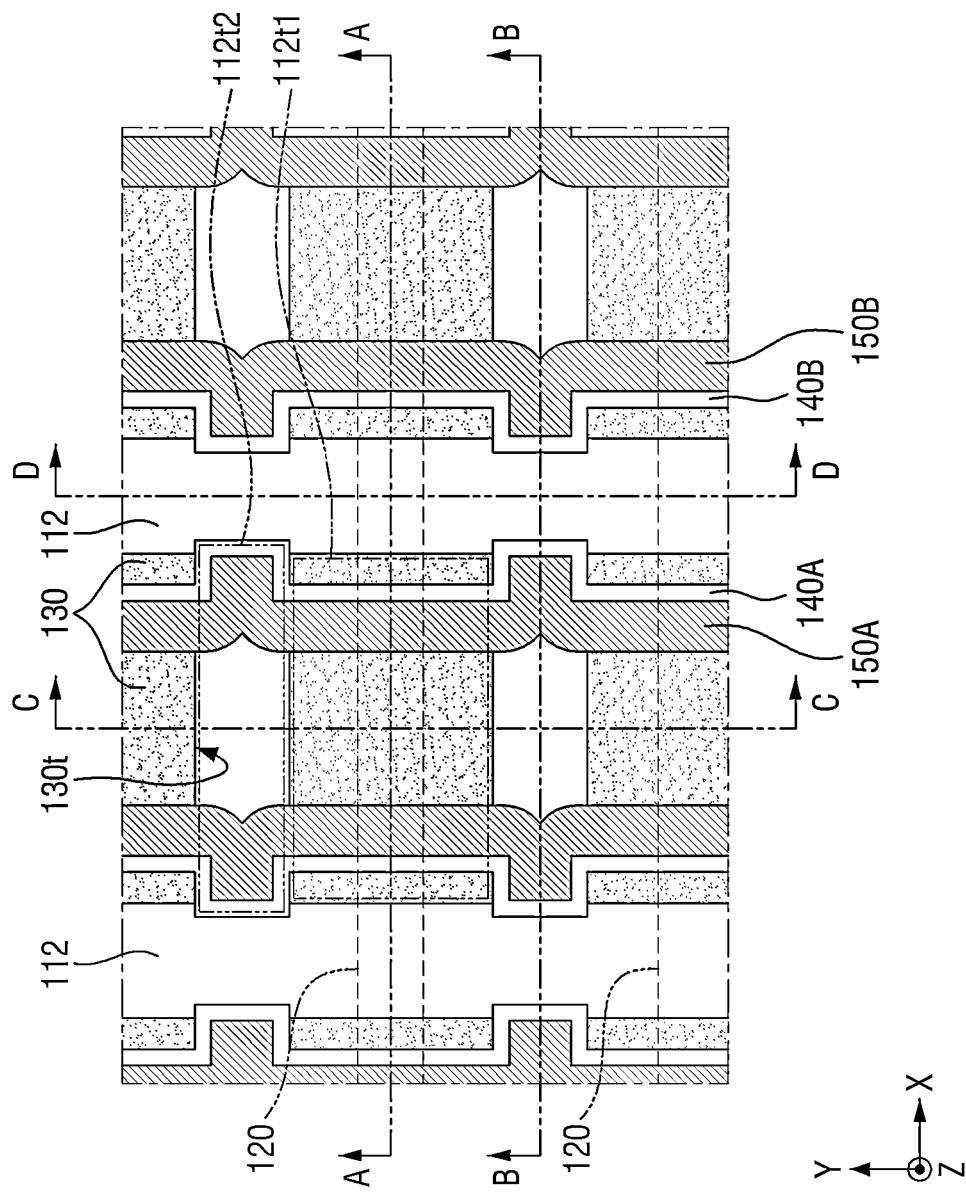
Figure 27:
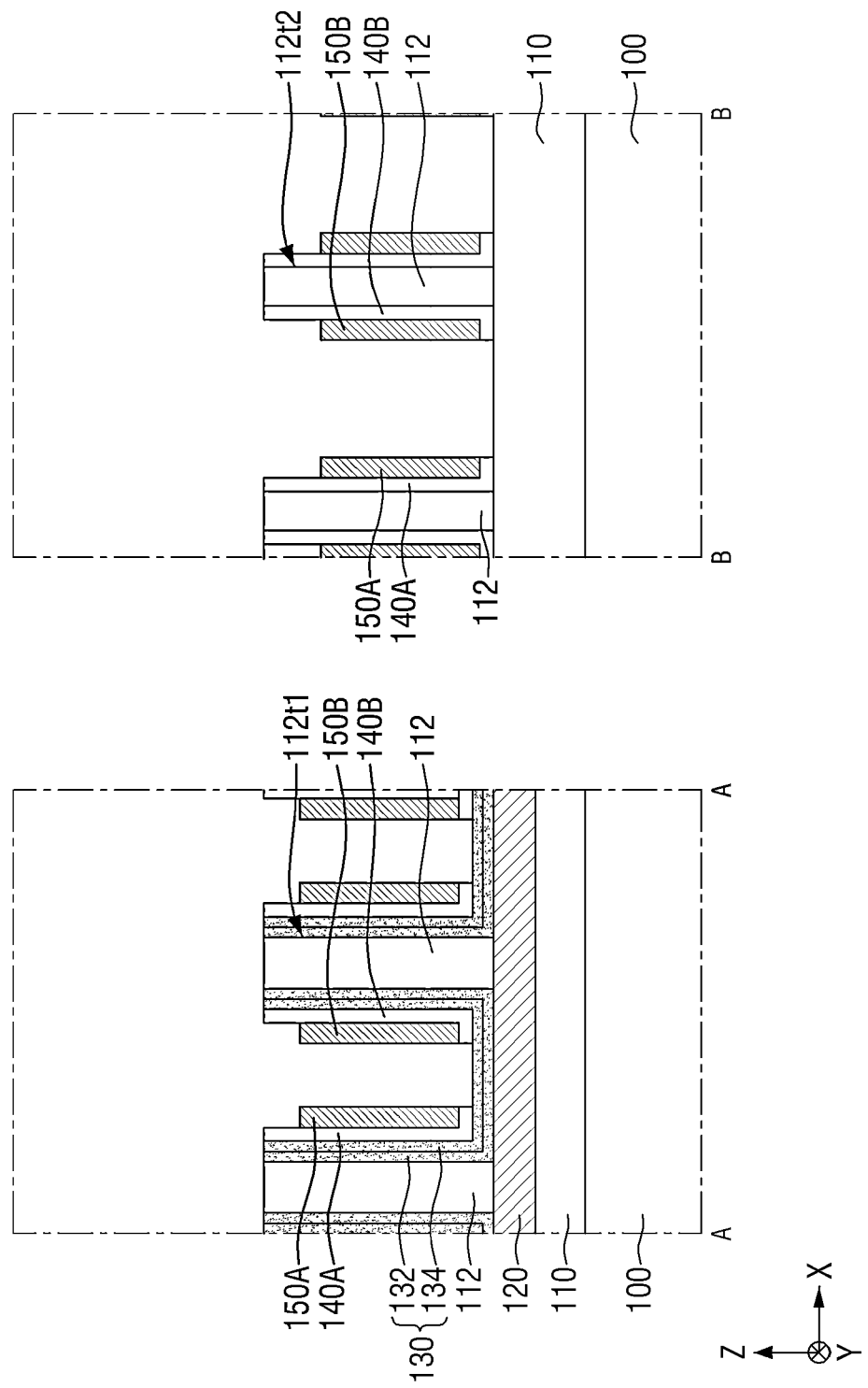
Figure 28:
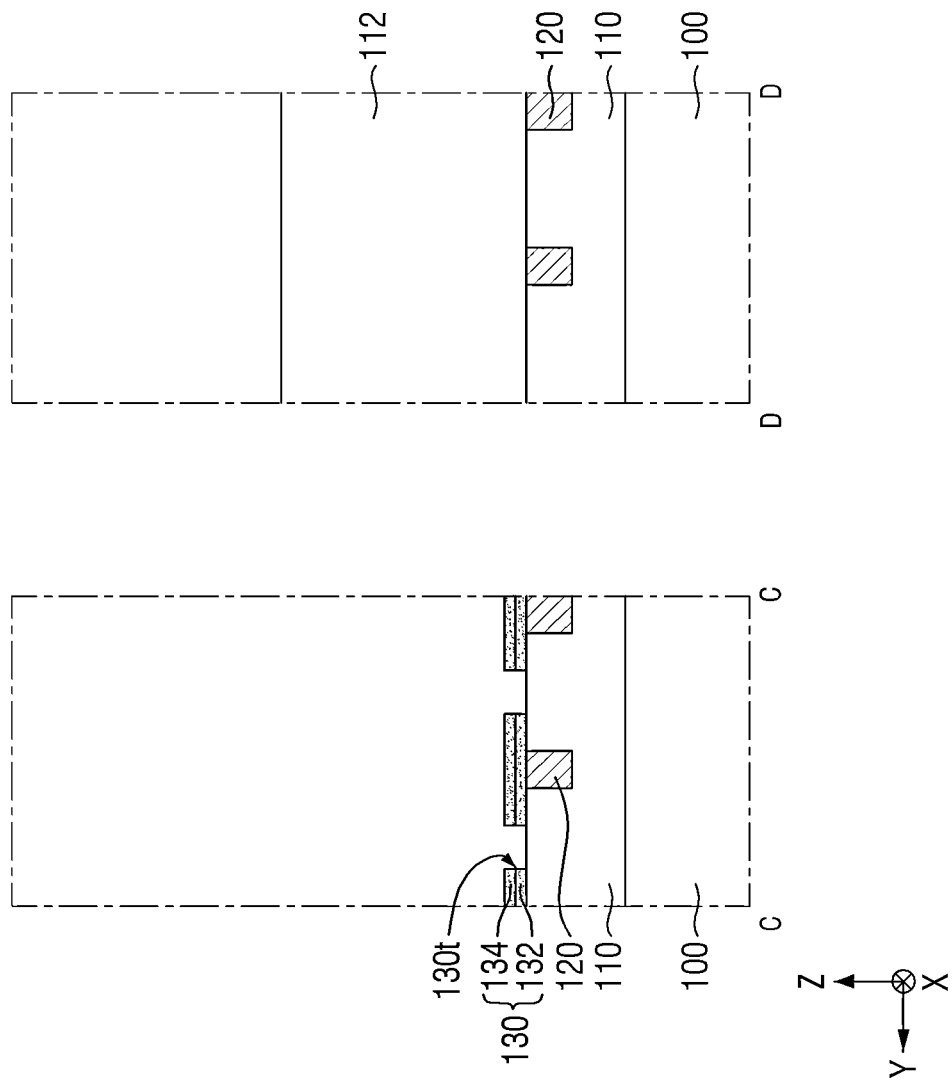

Referring to FIGS. 26 to 28, the preliminary gate insulating layer 140 and the preliminary gate electrode layer 150 are cut to form gate insulating layers 140A and 140B and gate electrodes 150A and 150B. For reference, FIG. 27 is a cross-sectional view taken along lines A-A and B-B of FIG. 26, and FIG. 28 is a cross-sectional view taken along lines C-C and D-D of FIG. 26.

For example, an etching process of cutting the preliminary gate insulating layer 140 and the preliminary gate electrode layer 150 in the first channel trench 112t1 may be performed. Accordingly, the gate electrodes 150A and 150B including the first gate electrode 150A and the second gate electrode 150B spaced apart from each other in the first direction X, may be formed in the first channel trench 112t1. Alternatively or additionally, the gate insulating layers 140A and 140B including the first gate insulating layer 140A and the second gate insulating layer 140B spaced apart from each other in the first direction X in the first channel trench 112t1, may be formed.

In some example embodiments, cutting the preliminary gate insulating layer 140 may be performed simultaneously with cutting the preliminary gate electrode layer 150. In this case, one end of each of the gate insulating layers 140A and 140B may be continuous with the side surfaces of the corresponding gate electrodes 150A and 150B.

In some example embodiments, when the preliminary gate insulating layer 140 and the preliminary gate electrode layer 150 are cut, the channel layer 130 may not be cut.

Figure 29:
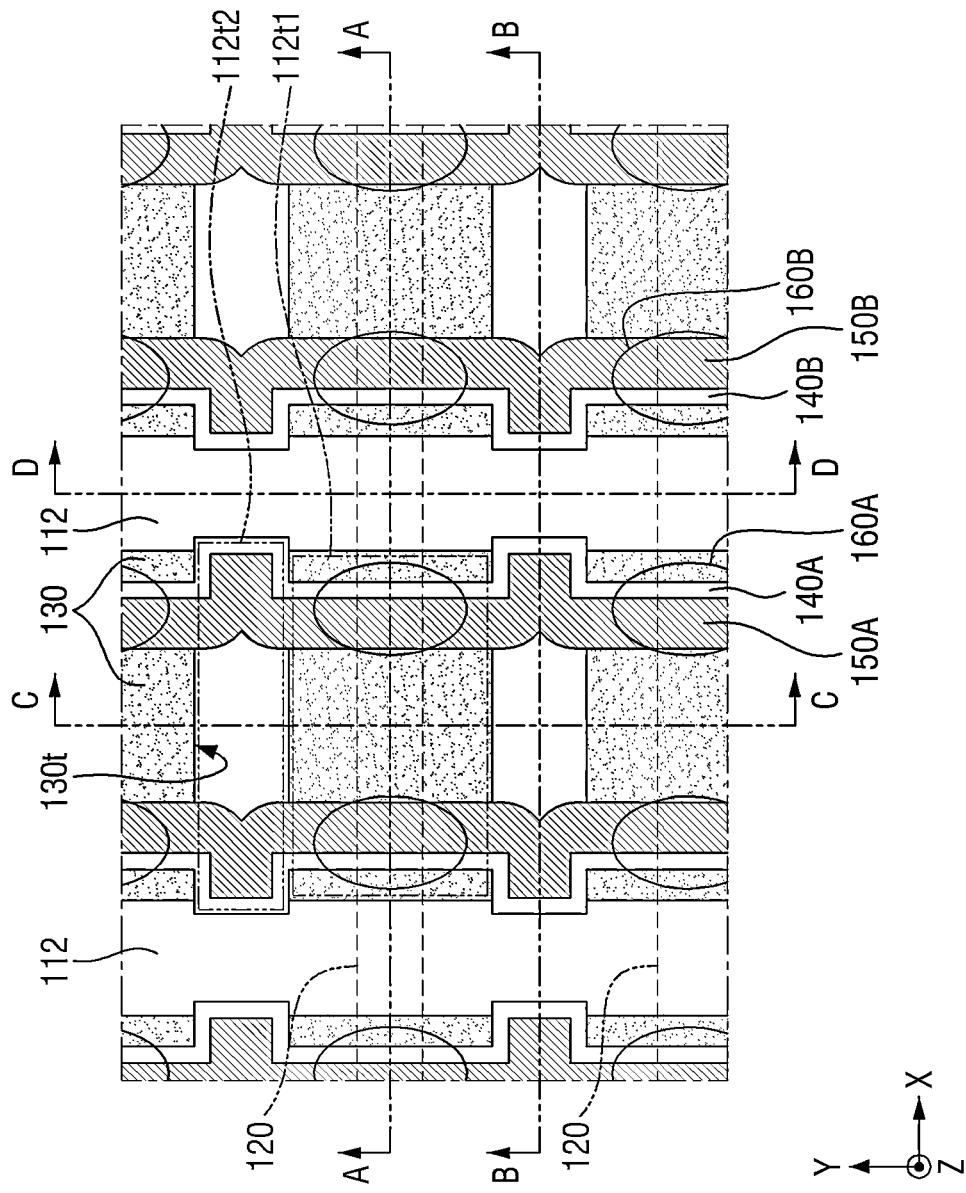
Figure 30:
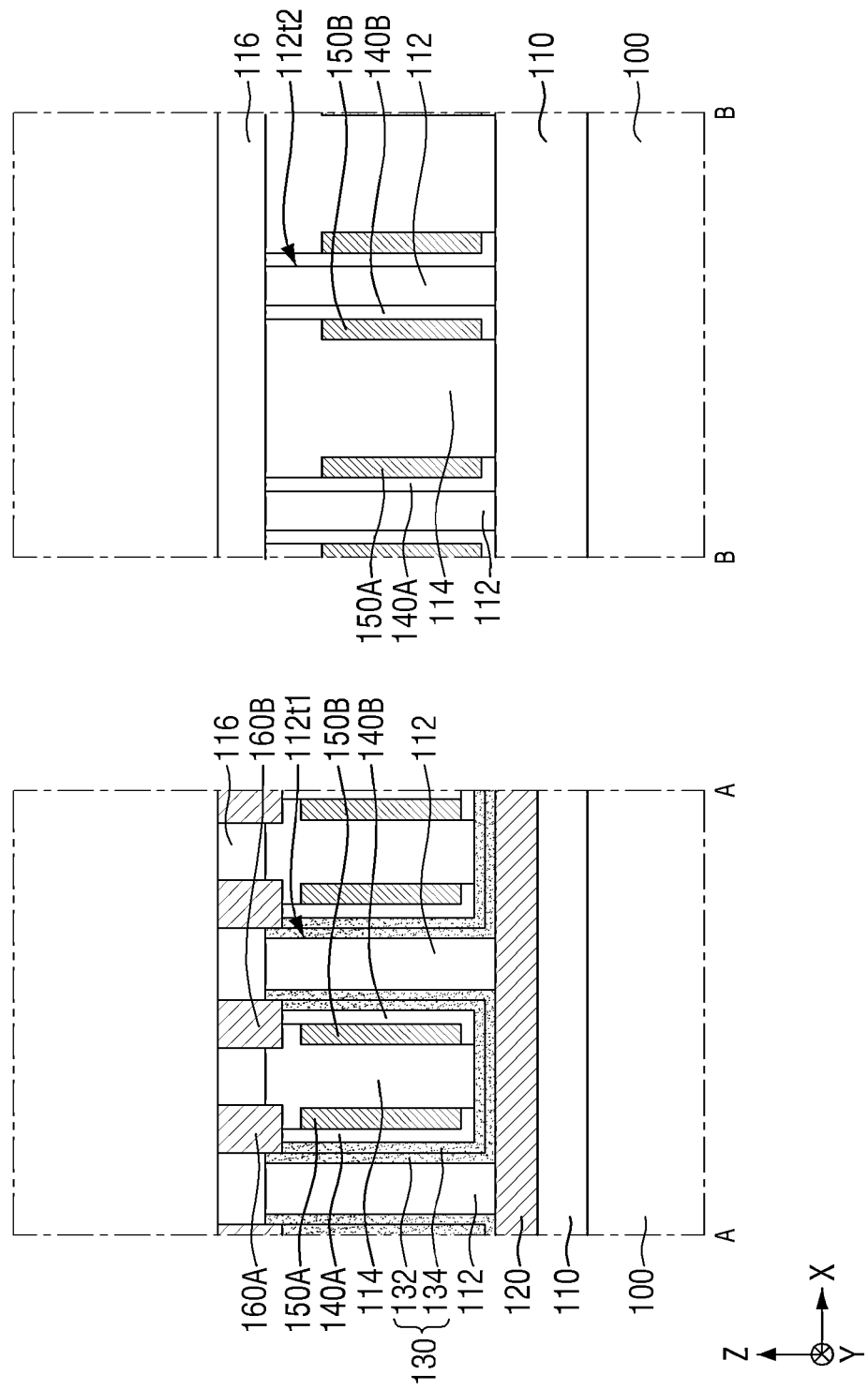
Figure 31:
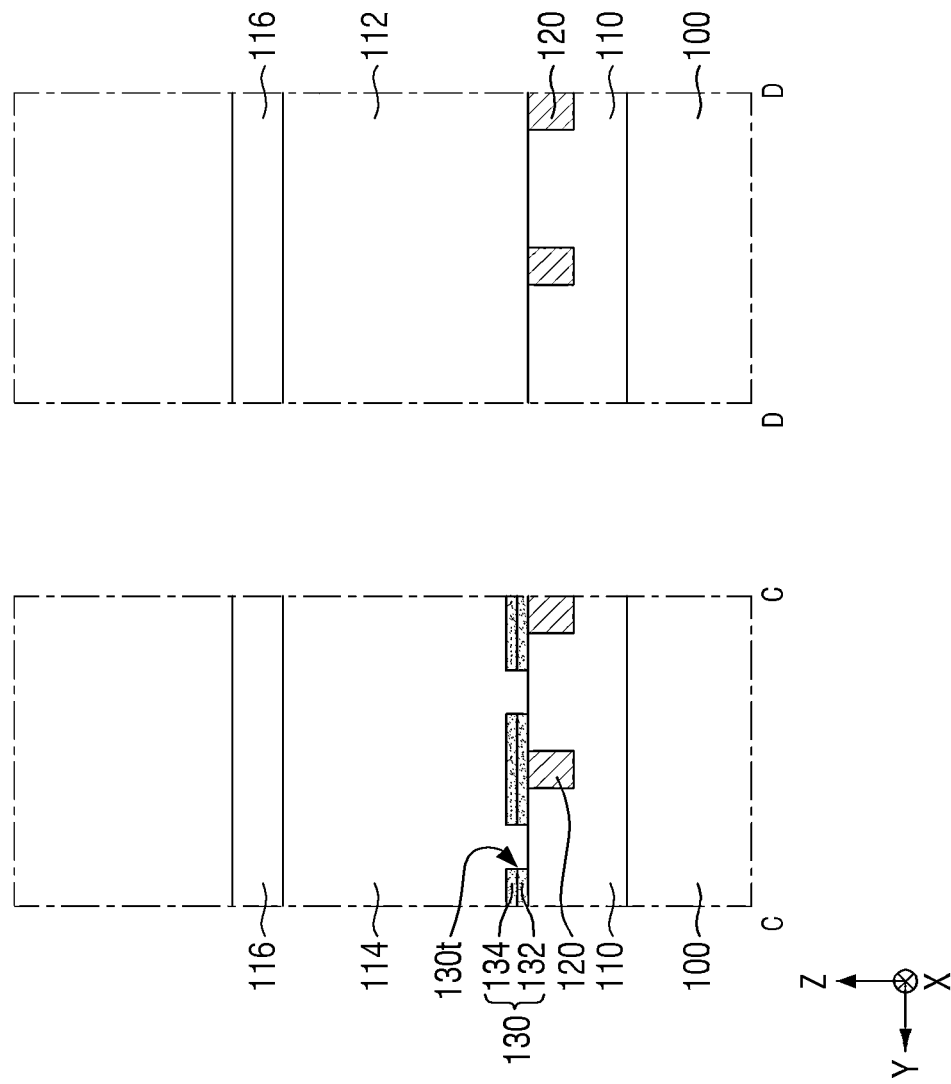

Referring to FIGS. 29 to 31, the landing pads 160A and 160B are formed on the channel layer 130. For reference, FIG. 30 is a cross-sectional view taken along lines A-A and B-B of FIG. 29, and FIG. 31 is a cross-sectional view taken along lines C-C and D-D of FIG. 29.

For example, the filling insulating layer 114 filling the first channel trench 112t1 may be formed on the channel layer 130, the gate insulating layers 140A and 140B, and the gate electrodes 150A and 150B. Subsequently, the second interlayer insulating layer 116 may be formed on the first interlayer insulating layer 112 and the filling insulating layer 114. The landing pads 160A and 160B may be formed to penetrate the second interlayer insulating layer 116 to be connected to the upper portion of the channel layer 130.

Subsequently, referring to FIGS. 1 to 4, the capacitor structures 170A and 170B are formed on the landing pads 160A and 160B.

For example, the lower electrodes 172A and 172B arranged to correspond to the landing pads 160A and 160B may be formed on the landing pads 160A and 160B. Subsequently, the capacitor dielectric layer 174 and the upper electrode 176 may be sequentially formed on the lower electrodes 172A and 172B. Accordingly, a method for fabricating a semiconductor memory device with improved performance may be provided.

Figure 32:
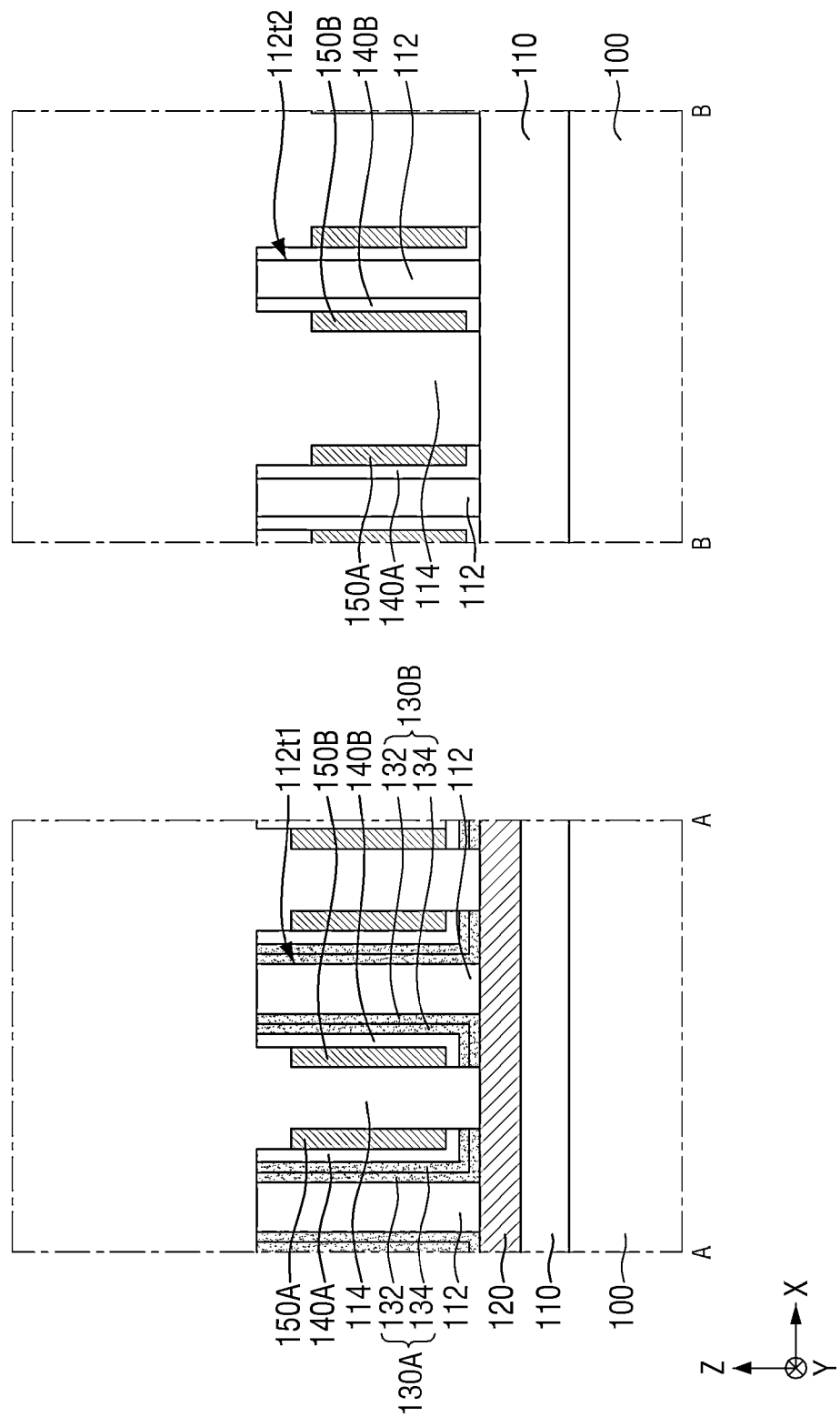
FIG. 32 is a view illustrating the intermediate step for explaining a method for fabricating a semiconductor memory device according to some example embodiments.

FIG. 32 is a view illustrating the intermediate step for explaining a method for fabricating a semiconductor memory device according to some example embodiments. For reference, FIG. 32 is a view illustrating an intermediate step for explaining the step after FIGS. 23 to 25.

Referring to FIG. 32, the channel layer 130 is cut.

For example, a trench extending in the second direction Y to cut the channel layer 130 may be formed in the first channel trench 112t1. Accordingly, the first channel layer 130A and the second channel layer 130B spaced apart from each other in the first direction X may be formed in the first channel trench 112t1.

In some example embodiments, cutting the channel layer 130 may be performed simultaneously with cutting the preliminary gate insulating layer 140 and the preliminary gate electrode layer 150. In this case, one end of each of the first channel layer 130A and the second channel layer 130B may be continuous with one end of the corresponding gate insulating layers 140A and 140B.

In some example embodiments, each of the first channel layer 130A and the second channel layer 130B may include the first oxide semiconductor layer 132 and the second oxide semiconductor layer 134 sequentially stacked on the conductive line 120.

Subsequently, the step described above with reference to FIGS. 29 to 31 may be performed. Accordingly, the semiconductor memory device described above with reference to FIG. 7 may be fabricated.

Figure 33:
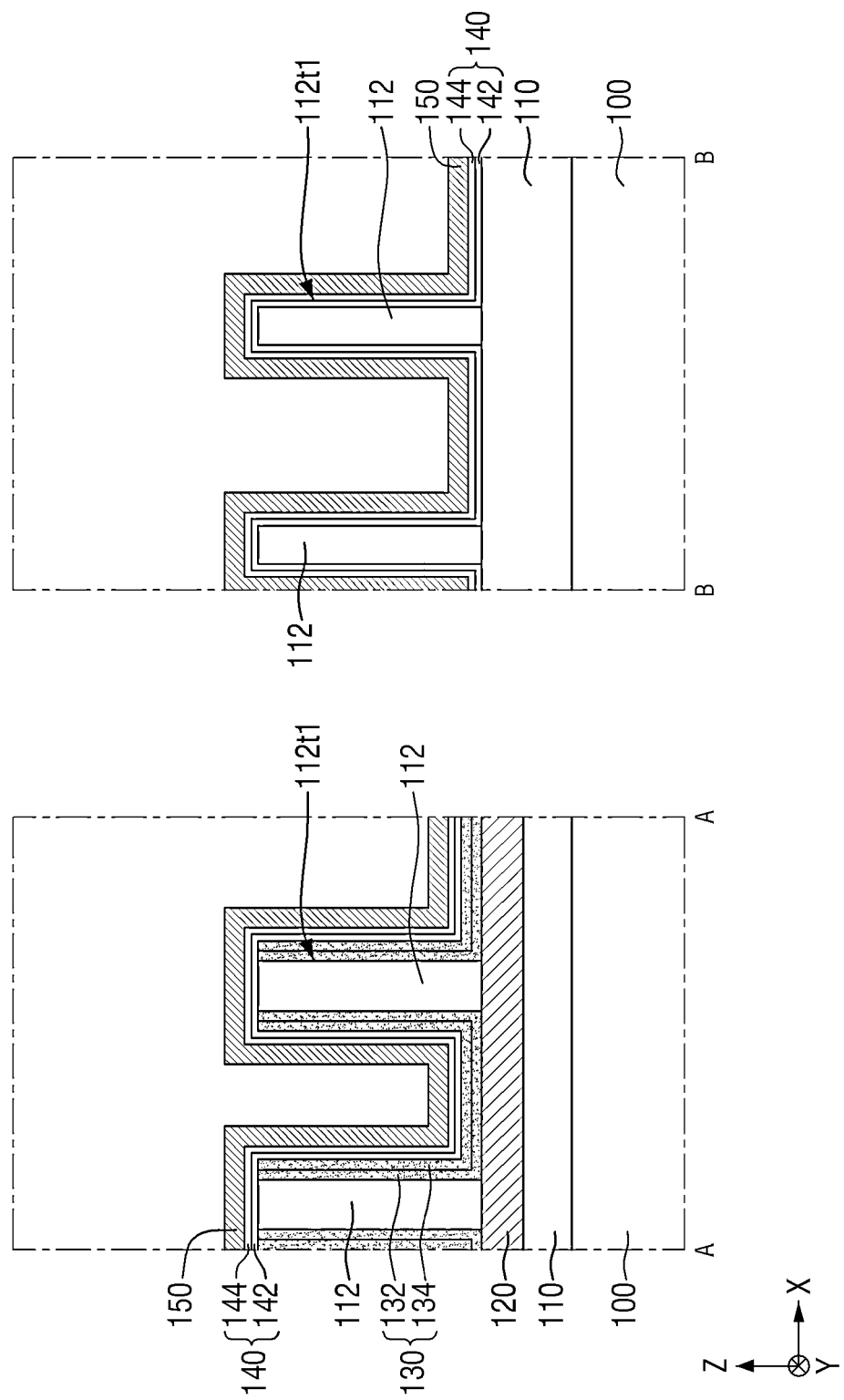
FIGS. 33 and 34 are views illustrating the intermediate steps for explaining a method for fabricating a semiconductor memory device according to some example embodiments.
Figure 34:
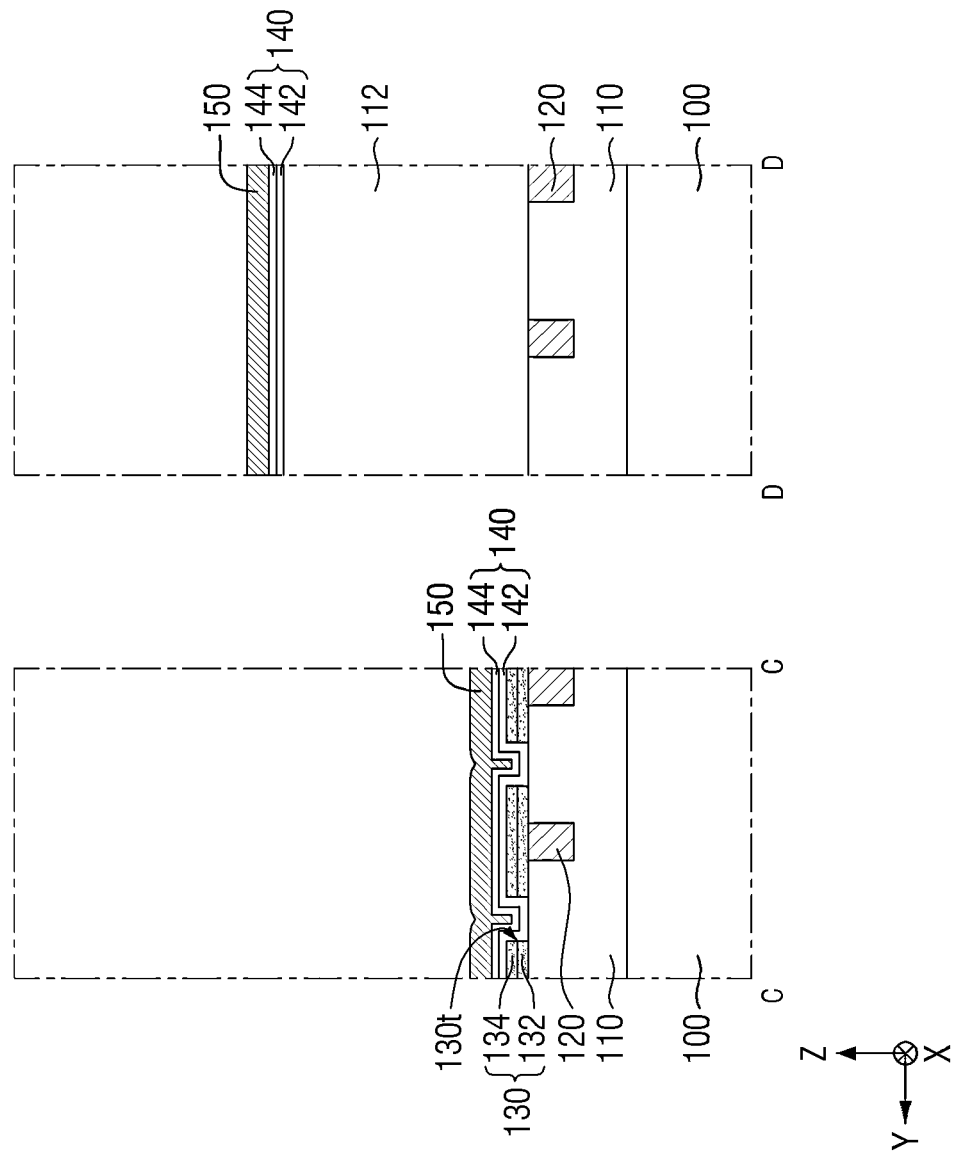

FIGS. 33 and 34 are views illustrating the intermediate steps for explaining a method for fabricating a semiconductor memory device according to some example embodiments. For reference, FIG. 32 is a view illustrating an intermediate step for explaining the step after FIGS. 20 to 22.

Referring to FIGS. 33 and 34, the preliminary gate insulating layer 140 includes the first dielectric layer 142 and the second dielectric layer 144 sequentially stacked on the channel layer 130.

For example, the first dielectric layer 142 extending conformally along the channel layer 130 may be formed. Subsequently, the second dielectric layer 144 extending conformally along the first dielectric layer 142 may be formed.

In some example embodiments, the second dielectric layer 144 may have a higher dielectric constant than the first dielectric layer 142. For example, the first dielectric layer 142 may include silicon oxide or silicon oxynitride having a relatively small dielectric constant, and the second dielectric layer 144 may include a high-k material having a relatively large dielectric constant.

Subsequently, the step described above with reference to FIGS. 26 to 31 may be performed. Accordingly, the semiconductor memory device described above with reference to FIGS. 8 and 9A may be fabricated.

Example embodiments are not necessarily limited to those disclosed above. Furthermore none of the above example embodiments are necessarily mutually exclusive with one another. For example, some example embodiments may include features disclosed and escribed with reference to one figure, and may also include features disclosed and described with reference to another figure.

While some example embodiments have been particularly shown and described with reference to example embodiments thereof, it will be understood by those of ordinary skill in the art that various changes in form and details may be made therein without departing from the spirit and scope of the present inventive concept as defined by the following claims. It is therefore desired that example embodiments be considered in all respects as illustrative and not restrictive, reference being made to the appended claims rather than the foregoing description to indicate the scope of the invention.

What is claimed is:

1. A semiconductor memory device comprising:
a conductive line on a substrate and extending in a first direction;
a first interlayer insulating layer on the substrate, the first interlayer insulating layer exposing at least a portion of the conductive line and defining a channel trench extending in a second direction that crosses the first direction, the channel trench having a vertical side surface extending from a top to a bottom surface;
a channel layer extending along the bottom surface of the channel trench and along the vertical side surface of the channel trench;
a first gate electrode and a second gate electrode spaced apart from each other in the first direction and extending in the second direction, the first gate electrode and the second gate electrode inside the channel trench;
a first gate insulating layer between the channel layer and the first gate electrode; and
a second gate insulating layer between the channel layer and the second gate electrode,
wherein the channel layer includes a first oxide semiconductor layer and a second oxide semiconductor layer sequentially stacked on the conductive line, and
the first oxide semiconductor layer has a greater crystallinity than the second oxide semiconductor layer.

2. The semiconductor memory device of claim 1, wherein the first gate insulating layer extends along a bottom surface of the first gate electrode and along a side surface of the first gate electrode, and
the second gate insulating layer extends along a bottom surface of the second gate electrode and along a side surface of the second gate electrode.

3. The semiconductor memory device of claim 1, wherein each of the first oxide semiconductor layer and the second oxide semiconductor layer includes an oxide semiconductor material containing indium (In).

4. The semiconductor memory device of claim 3, wherein the first oxide semiconductor layer includes at least one of spinel indium gallium zinc oxide (IGZO) or c-axis aligned crystalline IGZO (CAAC IGZO).

5. The semiconductor memory device of claim 3, wherein the second oxide semiconductor layer includes at least one of amorphous indium gallium zinc oxide (IGZO), amorphous indium tin oxide (ITO), or amorphous indium gallium tin oxide (IGTO).

6. The semiconductor memory device of claim 1, wherein each of the first gate insulating layer and the second gate insulating layer includes a first dielectric layer and a second dielectric layer sequentially stacked on the channel layer, and
the second dielectric layer has a higher dielectric constant than the first dielectric layer.

7. The semiconductor memory device of claim 1, wherein the channel layer defines a separation trench extending in the first direction to cut the channel layer.

8. The semiconductor memory device of claim 1, further comprising:
a first capacitor structure on the first interlayer insulating layer and connected to one end of the channel layer adjacent to the first gate electrode; and
a second capacitor structure on the first interlayer insulating layer and connected to the other end of the channel layer adjacent to the second gate electrode.

9. The semiconductor memory device of claim 1, further comprising:
a peripheral circuit element on the substrate and electrically connected to the conductive line; and
an inter-wire insulating layer on the substrate and covering the peripheral circuit element,
wherein the first interlayer insulating layer is stacked on a top surface of the inter-wire insulating layer.

10. A semiconductor memory device comprising:
a conductive line on a substrate and extending in a first direction;
a first interlayer insulating layer on the substrate, the first interlayer insulating layer exposing at least a portion of the conductive line and including a channel trench extending in a second direction that crosses the first direction, the channel trench having a vertical side surface extending from a top to a bottom surface;
a channel layer extending along the bottom surface of the channel trench and along the vertical side surface of the channel trench;
a first gate electrode inside the channel trench, the first gate electrode extending in the second direction; and
a first gate insulating layer between the channel layer and the first gate electrode,
wherein the channel layer includes a first oxide semiconductor layer and a second oxide semiconductor layer sequentially stacked on the conductive line,
the first oxide semiconductor layer has a greater crystallinity than the second oxide semiconductor layer,
the first gate insulating layer includes a first dielectric layer and a second dielectric layer sequentially stacked on the channel layer, and
the second dielectric layer has a higher dielectric constant than the first dielectric layer.

11. The semiconductor memory device of claim 10, wherein the first gate insulating layer extends along a bottom surface of the first gate electrode and along a side surface of the first gate electrode.

12. The semiconductor memory device of claim 11, wherein one end of the first gate insulating layer is continuous with the side surface of the first gate electrode.

13. The semiconductor memory device of claim 10, wherein the first dielectric layer includes silicon oxide.

14. The semiconductor memory device of claim 10, wherein the second dielectric layer includes at least one of aluminum oxide or hafnium oxide.

15. The semiconductor memory device of claim 10, further comprising:
a second gate electrode in the channel trench, the second gate electrode spaced apart from the first gate electrode in the first direction and extending in the second direction; and
a second gate insulating layer between the channel layer and the second gate electrode,
wherein each of the first gate insulating layer and the second gate insulating layer includes the first dielectric layer and the second dielectric layer.

16. A semiconductor memory device comprising:
a bit line on a substrate and extending in a first direction;
a first interlayer insulating layer on the substrate, the first interlayer insulating layer exposing at least a portion of the bit line and including a channel trench extending in a second direction that crosses the first direction, the channel trench having a vertical side surface extending from a top to a bottom surface;

a channel layer extending along the bottom surface of the channel trench and along the vertical side surface of the channel trench;

a first word line and a second word line spaced apart from each other in the first direction and extending in the second direction, the first word line and the second word line inside the channel trench;

a first gate insulating layer between the channel layer and the first word line;

a second gate insulating layer between the channel layer and the second word line;

a first capacitor structure on the first interlayer insulating layer and connected to one end of the channel layer that is adjacent to the first word line; and a second capacitor structure on the first interlayer insulating layer and connected to the other end of the channel layer that is adjacent to the second word line, wherein the channel layer includes a first oxide semiconductor layer and a second oxide semiconductor layer sequentially stacked on the bit line, and the first oxide semiconductor layer has a greater crystallinity than the second oxide semiconductor layer.

17. The semiconductor memory device of claim 16, further comprising:

a filling insulating layer on the first interlayer insulating layer and covering the first interlayer insulating layer;

a first landing pad penetrating the filling insulating layer to connect one end of the channel layer to the first capacitor structure; and a second landing pad penetrating the filling insulating layer to connect the other end of the channel layer to the second capacitor structure.

18. The semiconductor memory device of claim 17, wherein the first landing pad contacts at least a part of a side surface of the channel layer.

19. The semiconductor memory device of claim 17, further comprising:

a contact pattern between one end of the channel layer and the first landing pad, wherein the contact pattern includes at least one of indium tin oxide (ITO), titanium (Ti), or tantalum (Ta).

20. The semiconductor memory device of claim 16, further comprising:

a contact line between the bit line and the channel layer, wherein the contact line includes at least one of indium tin oxide (ITO), titanium (Ti), and tantalum (Ta).

* * * * *